United States Patent
Hanzawa et al.

(10) Patent No.: US 12,408,454 B2
(45) Date of Patent: Sep. 2, 2025

(54) SOLID-STATE IMAGING DEVICE AND IMAGING APPARATUS

(71) Applicant: SONY SEMICONDUCTOR SOLUTIONS CORPORATION, Kanagawa (JP)

(72) Inventors: Katsuhiko Hanzawa, Kanagawa (JP); Shinichi Miyake, Kanagawa (JP); Kazuyuki Tomida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 209 days.

(21) Appl. No.: 18/263,729

(22) PCT Filed: Jan. 28, 2022

(86) PCT No.: PCT/JP2022/003257
§ 371 (c)(1),
(2) Date: Aug. 1, 2023

(87) PCT Pub. No.: WO2022/172777
PCT Pub. Date: Aug. 18, 2022

(65) Prior Publication Data
US 2024/0120353 A1    Apr. 11, 2024

(30) Foreign Application Priority Data
Feb. 10, 2021   (JP) ................. 2021-020074

(51) Int. Cl.
*H10F 39/00*    (2025.01)
*H04N 25/47*    (2023.01)
(Continued)

(52) U.S. Cl.
CPC ....... *H10F 39/80377* (2025.01); *H04N 25/47* (2023.01); *H04N 25/779* (2023.01);
(Continued)

(58) Field of Classification Search
CPC .... H04N 25/779; H04N 25/47; H10D 30/021; H10D 30/67; H10D 84/00;
(Continued)

(56) References Cited

U.S. PATENT DOCUMENTS

| 2020/0260039 | A1* | 8/2020 | Niwa | ................ | H04N 25/47 |
| 2022/0132054 | A1* | 4/2022 | Zhu | ................ | H04N 25/75 |

FOREIGN PATENT DOCUMENTS

| JP | 2020-088722 A | 6/2020 |
| WO | 2019/087471 A1 | 5/2019 |

OTHER PUBLICATIONS

International Search Report and Written Opinion of PCT Application No. PCT/JP2022/003257, issued on Apr. 5, 2022, 09 pages of ISRWO.

\* cited by examiner

*Primary Examiner* — Lin Ye
*Assistant Examiner* — Chriss S Yoder, III
(74) *Attorney, Agent, or Firm* — CHIP LAW GROUP

(57) ABSTRACT

A solid-state imaging device (200) includes a photoelectric conversion device (211), a current-voltage conversion circuit (310), and an output circuit. The photoelectric conversion device (211) performs photoelectric conversion of incident light. The current-voltage conversion circuit (310) includes a first transistor (311) that converts an amount of electric charge generated by photoelectric conversion into a voltage signal. The output circuit includes a second transistor having an S value smaller than an S value of the first transistor (311) and generates an output signal based on the voltage signal.

18 Claims, 22 Drawing Sheets

(51) Int. Cl.
*H04N 25/779* (2023.01)
*H10D 30/01* (2025.01)
*H10D 84/01* (2025.01)
*H10D 84/83* (2025.01)

(52) U.S. Cl.
CPC ....... *H10D 30/021* (2025.01); *H10D 84/0126* (2025.01); *H10D 84/83* (2025.01); *H10F 39/80373* (2025.01); *H10F 39/809* (2025.01)

(58) Field of Classification Search
CPC .. H10D 84/0126; H10D 84/038; H10D 84/83; H10F 39/12; H10F 39/80373; H10F 39/80377; H10F 39/809
See application file for complete search history.

FIG.12

| S VALUE SMALL | S VALUE LARGE |
|---|---|
| Bulk | Bulk |
| FDSOI | PDSOI |
| Fin WIDTH SMALL | Fin WIDTH LARGE |
| GAA THICKNESS SMALL | GAA THICKNESS LARGE |
| Bulk | PDSOI |

FIG.13

| S VALUE SMALL | S VALUE LARGE |
|---|---|
| GATE LENGTH LONG | GATE LENGTH SHORT |
| NORMAL CHANNEL DOPING | COUNTER DOPING |
| S/D SHALLOW, LOW CONCENTRATION | S/D DEEP, HIGH CONCENTRATION |
| SW THICK | SW THIN |
| Back bias | Forward bias |

FIG.18

| S VALUE SMALL | S VALUE LARGE | |
|---|---|---|
| Bulk | PDSOI | |
| FDSOI | Bulk | |
| FDSOI | FinFET | Fin WIDTH IS LARGER THAN 1/3 OF GATE LENGTH OF FinFET |
| FDSOI | GAA | GAA WIDTH IS LARGER THAN 1/2 OF GATE LENGTH OF GAA |
| FinFET | Bulk | Fin WIDTH IS SMALLER THAN 1/3 OF GATE LENGTH OF FinFET |
| FinFET | PDSOI | Fin WIDTH IS SMALLER THAN 1/3 OF GATE LENGTH OF FinFET |
| FinFET | GAA | Fin WIDTH IS SMALLER THAN 1/3 OF GATE LENGTH OF FinFET<br>GAA WIDTH IS SMALLER THAN 1/2 OF GATE LENGTH OF GAA |
| GAA | Bulk | GAA WIDTH IS SMALLER THAN 1/2 OF GATE LENGTH OF GAA |
| GAA | PDSOI | GAA WIDTH IS SMALLER THAN 1/2 OF GATE LENGTH OF GAA |
| GAA | FinFET | GAA WIDTH IS LARGER THAN 1/2 OF GATE LENGTH OF GAA<br>Fin WIDTH IS LARGER THAN 1/3 OF GATE LENGTH OF FinFET |

SOLID-STATE IMAGING DEVICE AND IMAGING APPARATUS

CROSS REFERENCE TO RELATED APPLICATIONS

This application is a U.S. National Phase of International Patent Application No. PCT/JP2022/003257 filed on Jan. 28, 2022, which claims priority benefit of Japanese Patent Application No. JP 2021-020074 filed in the Japan Patent Office on Feb. 10, 2021. Each of the above-referenced applications is hereby incorporated herein by reference in its entirety.

FIELD

The present disclosure relates to a solid-state imaging device and an imaging apparatus.

BACKGROUND

Asynchronous imaging apparatuses with an address event detection circuit provided for each pixel have recently been used. The address event detection circuit detects an address event that the light amount of a pixel exceeds a threshold value in real time for each pixel address. A solid-state imaging device that detects an address event for each pixel like this is also referred to as an event-based vision sensor (EVS).

In the solid-state imaging device described above, a current-voltage conversion circuit converts a photocurrent generated by photoelectric conversion into a voltage. In such a solid-state imaging device, a technology of having two stage loop circuits in the current-voltage conversion circuit is known to increase a conversion gain in converting a photocurrent into a voltage.

CITATION LIST

Patent Literature

Patent Literature 1: WO 2019/087471 A

SUMMARY

Technical Problem

Having n-stage loop circuits in the current-voltage conversion circuit increases the conversion gain by n times. However, increasing the number of the stages of the loop circuits to n increases the circuit area, which may be a factor that disturbs miniaturization of the solid-state imaging device.

In view of such circumstances, the present disclosure proposes a solid-state imaging device and an imaging apparatus capable of increasing the conversion gain of current-voltage conversion while preventing an increase in a circuit area.

The above problem or object is merely one of a plurality of problems or objects that may be solved or achieved by a plurality of embodiments disclosed in the present specification.

Solution to Problem

According to the present disclosure, a solid-state imaging device is provided. The solid-state imaging device includes a photoelectric conversion device, a current-voltage conversion circuit, and an output circuit. The photoelectric conversion device performs photoelectric conversion of incident light. The current-voltage conversion circuit includes a first transistor that converts an amount of electric charge generated by photoelectric conversion into a voltage signal. The output circuit includes a second transistor having an S value smaller than an S value of the first transistor and generates an output signal based on the voltage signal.

BRIEF DESCRIPTION OF DRAWINGS

FIG. 12 is a table for explaining a relationship between the S value and transistors according to an embodiment of the present disclosure.

FIG. 13 is a table for explaining a method of adjusting the S value in a transistor having a bulk structure according to an embodiment of the present disclosure.

FIG. 18 is a table for explaining a relationship between the S value and transistors according to an embodiment of the present disclosure.

DESCRIPTION OF EMBODIMENTS

Figure 1:
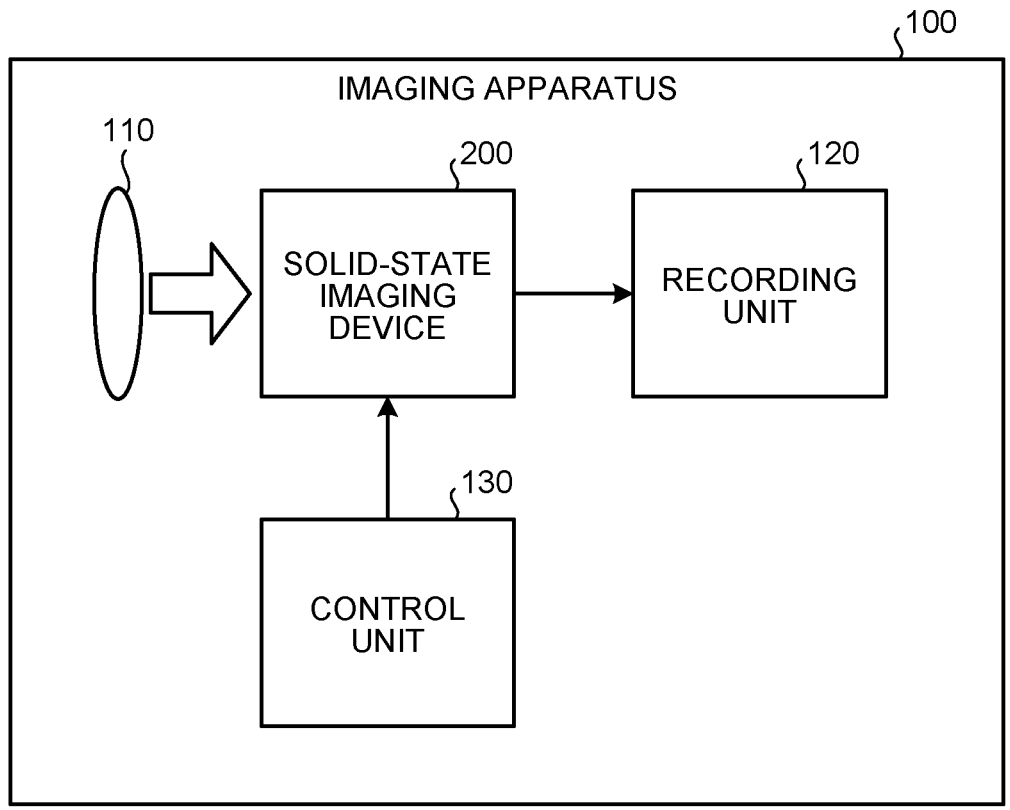
FIG. 1 is a block diagram depicting a configuration example of an imaging apparatus according to an embodiment of the present disclosure.

Hereinafter, preferred embodiments of the present disclosure will be described in detail with reference to the accompanying drawings. In the present specification and the drawings, components having substantially the same functional configuration are denoted by the same reference signs, and redundant description is omitted.

In the present specification and the drawings, similar components of different embodiments may be distinguished by adding different alphabets after the same reference signs. However, when it is not necessary to particularly distinguish each of similar components, only the same reference sign is assigned.

The drawings referred to in the following description are drawings for describing the embodiments of the present disclosure and promoting understanding thereof, and shapes, dimensions, ratios, and the like illustrated in the drawings may be different from actual ones for the sake of clarity. The solid-state imaging devices and the solid-state imaging apparatuses illustrated in the drawings may be appropriately modified in design in consideration of the following description and known technologies.

In the following description, "gate" represents a gate electrode of a field effect transistor (FET). "Drain" represents a drain electrode or a drain region of the FET, and "source" represents a source electrode or a source region of the FET.

The description will be given in the following order.
1. Configuration Example of Imaging Apparatus
1.1. Overall Configuration Example of Imaging Apparatus
1.2. Configuration Example of Solid-State Imaging Device
2. S Value of Transistor
3. Modification
4. Application Example to Mobile Body
5. Conclusion 1. Configuration Example of Imaging Apparatus 1.1. Overall Configuration Example of Imaging Apparatus FIG. 1 is a block diagram depicting a configuration example of an imaging apparatus 100 according to an embodiment of the present disclosure. The imaging apparatus 100 includes an optical unit 110, a solid-state imaging device 200, a recording unit 120, and a control unit 130. As the imaging apparatus 100, a camera mounted on an industrial robot, a vehicle-mounted camera, or the like is assumed.

The optical unit 110 collects incident light and guides the light to the solid-state imaging device 200. The solid-state imaging device 200 photoelectrically converts the incident light to generate image data. The solid-state imaging device 200 executes predetermined signal processing such as image recognition processing on the generated image data and outputs the processed data to the recording unit 120.

The recording unit 120 is formed of, for example, a flash memory or the like, and it records data output from the solid-state imaging device 200 and data output from the control unit 130.

The control unit 130 is formed of, for example, an information processing device such as an application processor, and it controls the solid-state imaging device 200 to output image data.

1.2. Configuration Example of Solid-State Imaging Device

Example of Stack Structure

Figure 2:
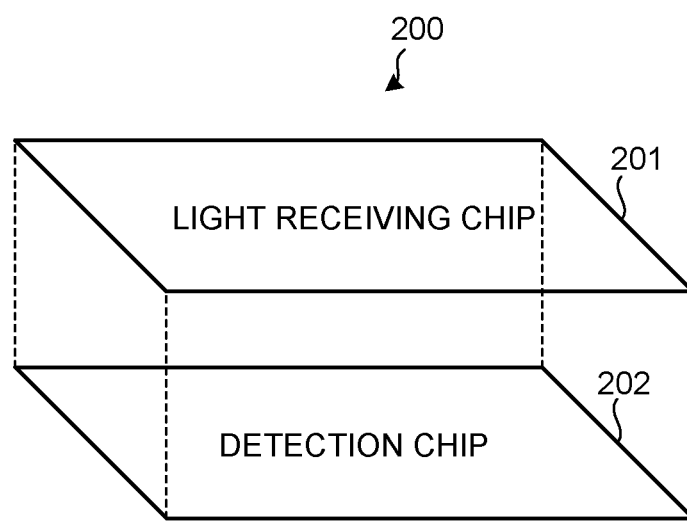
FIG. 2 is a diagram depicting an example of a stack structure of a solid-state imaging device according to an embodiment of the present disclosure.

FIG. 2 is a diagram depicting an example of a stack structure of the solid-state imaging device 200 according to an embodiment of the present disclosure. The solid-state imaging device 200 includes a detection chip 202 and a light receiving chip 201 stacked on the detection chip 202. These chips are electrically connected via a connection part such as a via. In addition to the via, connection may also be made by Cu—Cu bonding or a bump.

Layout Example of Light Receiving Chip

Figure 3:
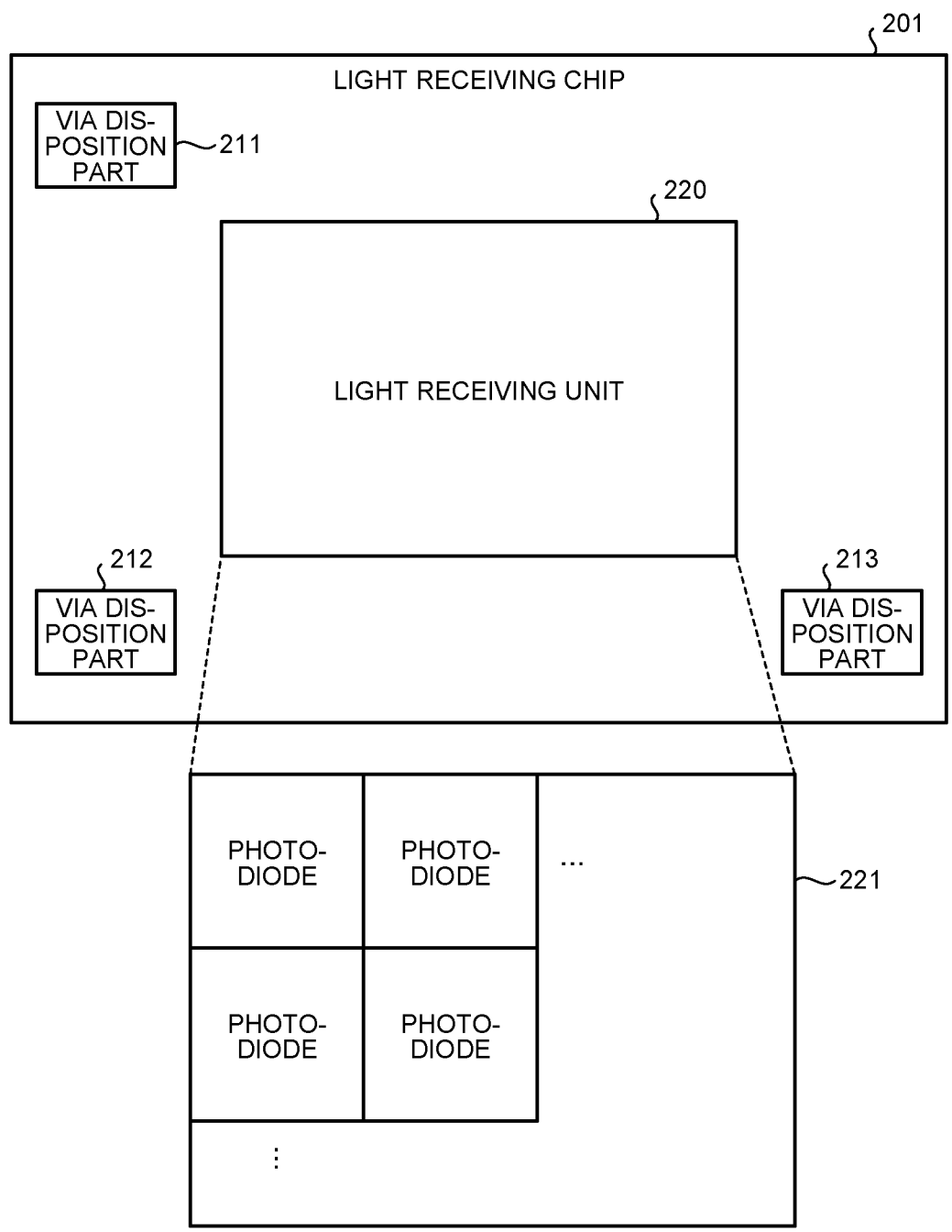
FIG. 3 is an example of a plan view of a light receiving chip according to an embodiment of the present disclosure.

FIG. 3 is an example of a plan view of the light receiving chip 201 according to an embodiment of the present disclosure. The light receiving chip 201 is provided with a light receiving unit 220 and via disposition parts 211, 212, and 213.

Vias connected to the detection chip 202 are disposed in the via disposition parts 211, 212, and 213. In the light receiving unit 220, a plurality of photodiodes 221 are arrayed in a two-dimensional lattice pattern. The photodiode 221 is a photoelectric conversion device that photoelectrically converts incident light to generate a photocurrent. Each of these photodiodes 221 is assigned with a pixel address including a row address and a column address and is treated as a pixel.

Figure 4:
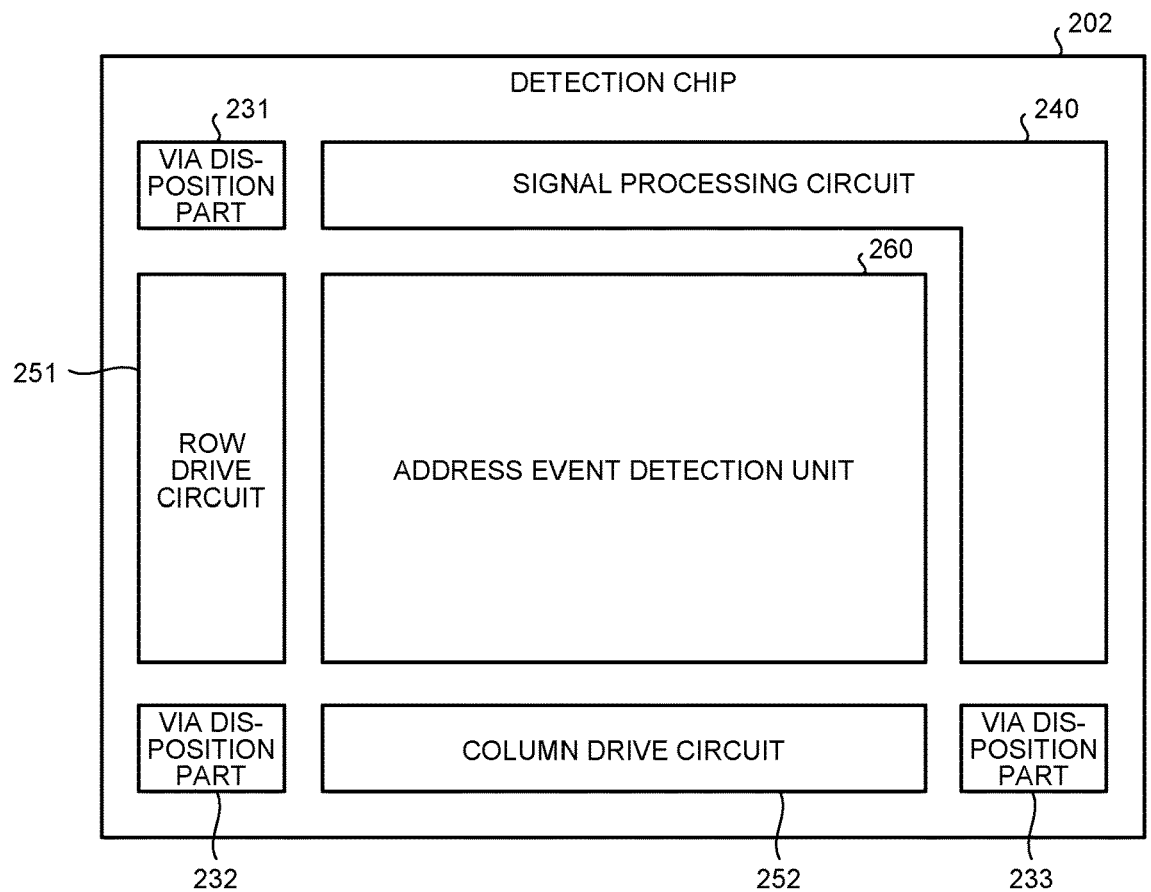
FIG. 4 is an example of a plan view of a detection chip according to an embodiment of the present disclosure.

FIG. 4 is an example of a plan view of the detection chip 202 according to an embodiment of the present disclosure.

The detection chip 202 includes via disposition parts 231, 232, and 233, a signal processing circuit 240, a row drive circuit 251, a column drive circuit 252, and an address event detection unit 260. Vias connected to the light receiving chip 201 are disposed in the via disposition parts 231, 232, and 233. Alternatively, a via may be disposed between the light receiving unit 220 and the address event detection unit 260. That is, the via disposition part 211 may be disposed in the light receiving unit 220.

The address event detection unit 260 generates a detection signal from the photocurrent of each of the plurality of photodiodes 221 and outputs the detection signal to the signal processing circuit 240. The detection signal is a 1-bit signal indicating whether an address event that the amount of incident light exceeds a predetermined threshold value is detected.

The row drive circuit 251 selects a row address and causes the address event detection unit 260 to output a detection signal corresponding to the row address.

The column drive circuit 252 selects a column address and causes the address event detection unit 260 to output a detection signal corresponding to the column address.

The signal processing circuit 240 executes predetermined signal processing on the detection signal from the address event detection unit 260. The signal processing circuit 240 arrays the detection signals as pixel signals in a two-dimensional lattice pattern and acquires image data having 1-bit information for each pixel. Then, the signal processing circuit 240 executes signal processing such as image recognition processing on the image data.

Figure 5:
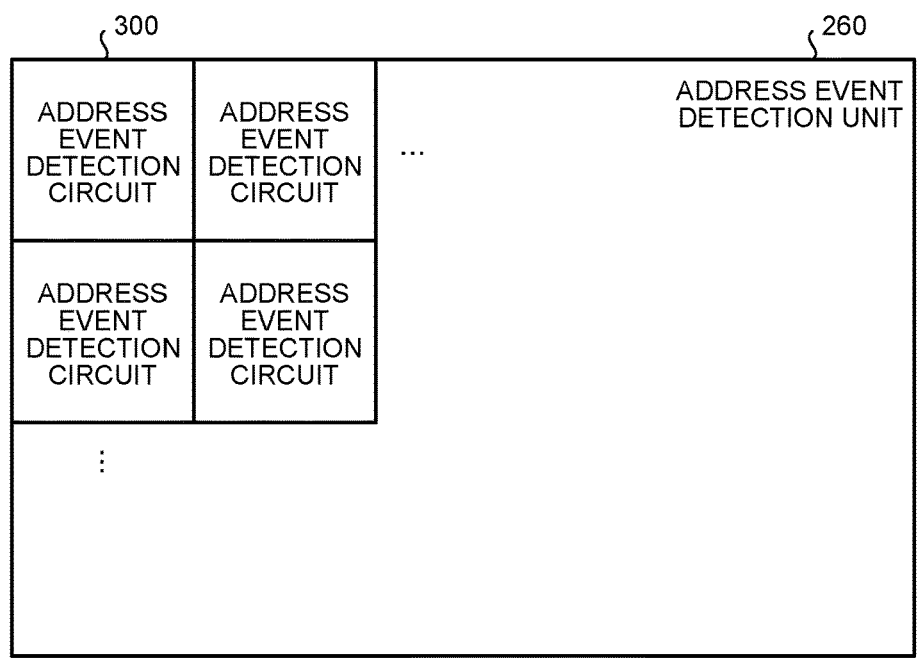
FIG. 5 is an example of a plan view of an address event detection unit according to an embodiment of the present disclosure.

FIG. 5 is an example of a plan view of the address event detection unit 260 according to an embodiment of the present disclosure. In the address event detection unit 260, a plurality of address event detection circuits 300 are arrayed in a two-dimensional lattice pattern. Each of the address event detection circuits 300 is assigned with a pixel address and connected to the corresponding photodiode 221 having the same address.

The address event detection circuit 300 quantizes a voltage signal according to the photocurrent from the corresponding photodiode 221 and outputs the quantized voltage signal as a detection signal.

Configuration Example of Address Event Detection Circuit

Figure 6:
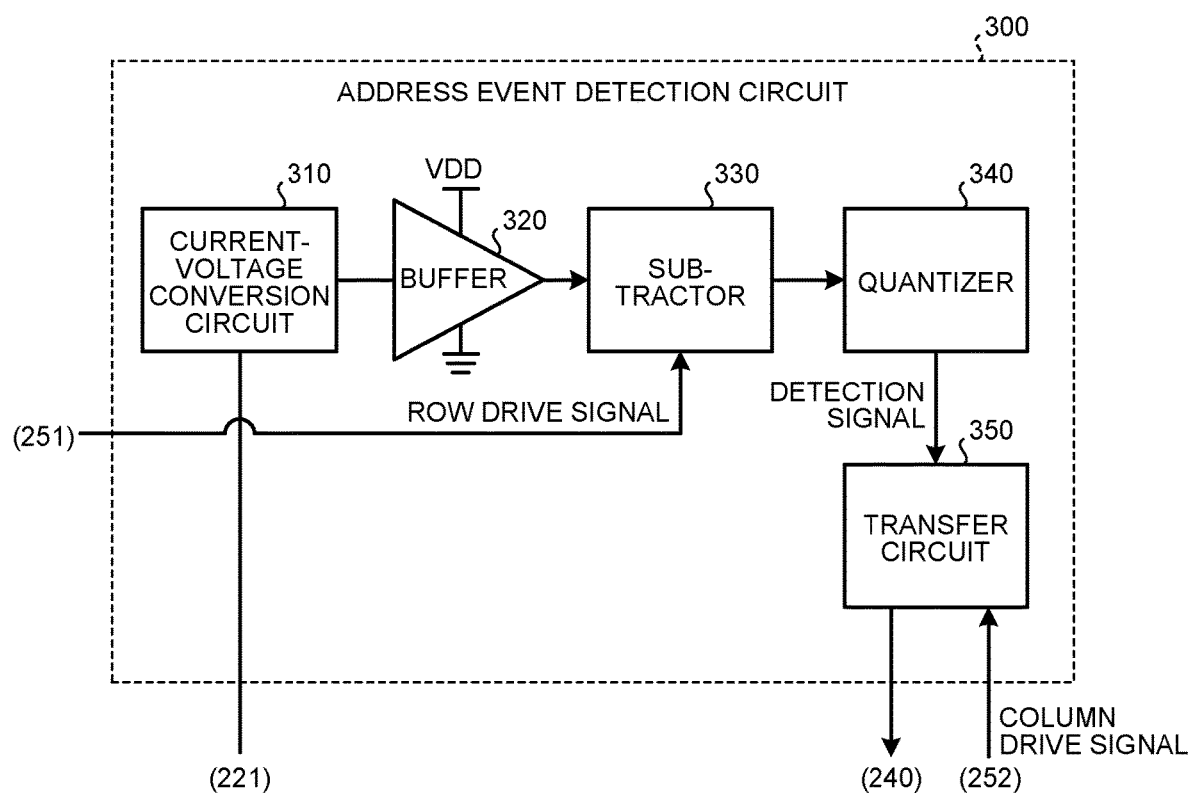
FIG. 6 is a block diagram depicting a configuration example of an address event detection circuit according to an embodiment of the present disclosure.

FIG. 6 is a block diagram depicting a configuration example of the address event detection circuit 300 according to an embodiment of the present disclosure. The address event detection circuit 300 includes a current-voltage conversion circuit 310, a buffer 320, a subtractor 330, a quantizer 340, and a transfer circuit 350.

The current-voltage conversion circuit 310 converts the photocurrent from the corresponding photodiode 221 into a voltage signal. The current-voltage conversion circuit 310 supplies the voltage signal to the buffer 320.

The buffer 320 corrects the voltage signal from the current-voltage conversion circuit 310. The buffer 320 outputs the corrected voltage signal to the subtractor 330.

The subtractor 330 lowers the level of the voltage signal from the buffer 320 according to the row drive signal from a row drive circuit 251. The subtractor 330 supplies the lowered voltage signal to the quantizer 340.

The quantizer 340 quantizes the voltage signal from the subtractor 330 into a digital signal and outputs the digital signal to the transfer circuit 350 as a detection signal.

The transfer circuit 350 transfers the detection signal from the quantizer 340 to the signal processing circuit 240 according to the column drive signal from a column drive circuit 252.

The buffer 320, the subtractor 330, and the quantizer 340 are also collectively referred to as an output circuit. The output circuit is a circuit that generates a detection signal (an example of output signals) based on the voltage signal after conversion by the current-voltage conversion circuit 310.

Configuration Example of Current-Voltage Conversion Circuit

Figure 7:
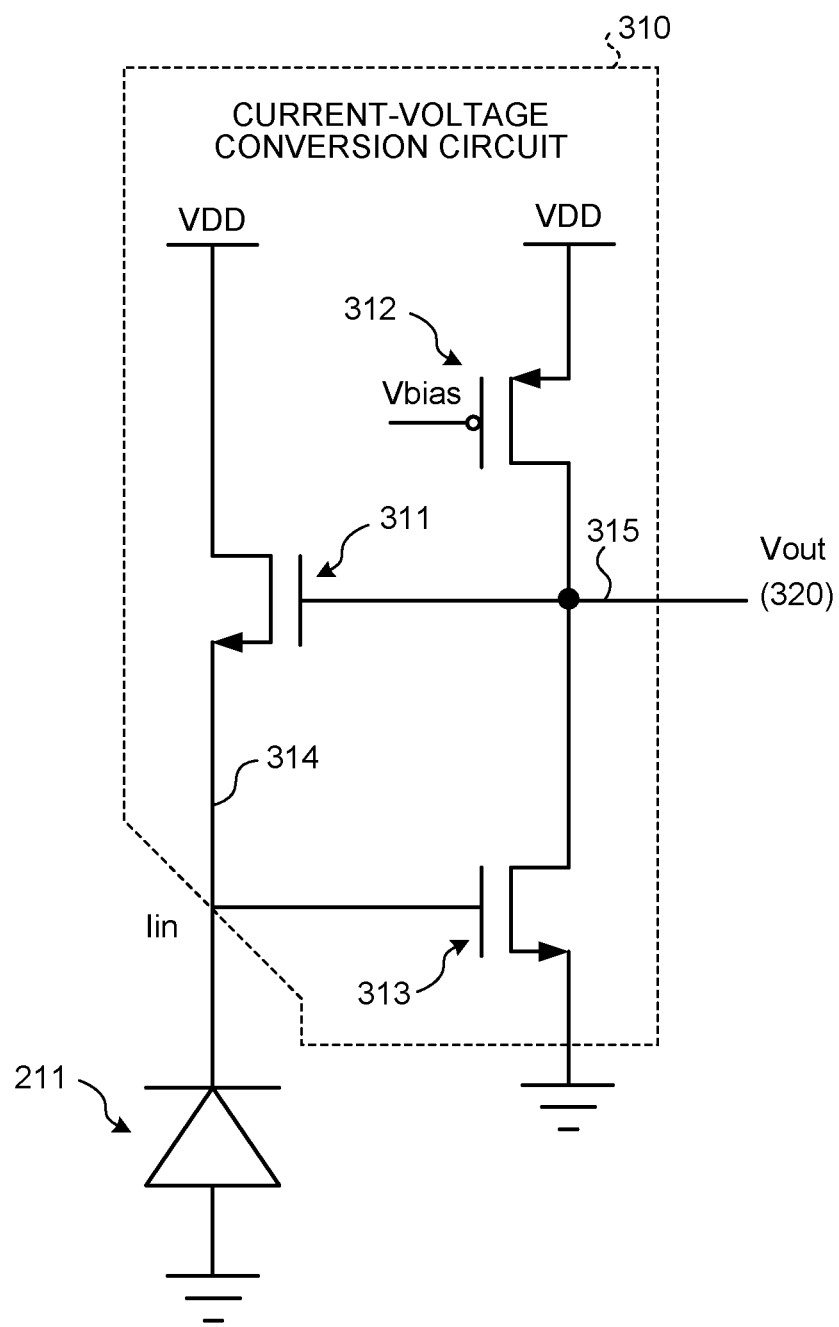
FIG. 7 is a circuit diagram depicting a configuration example of a current-voltage conversion circuit according to an embodiment of the present disclosure.

FIG. 7 is a circuit diagram depicting a configuration example of the current-voltage conversion circuit 310 according to an embodiment of the present disclosure. The current-voltage conversion circuit 310 includes a conversion transistor 311, a current source transistor 312, and a voltage supply transistor 313. As the conversion transistor 311 and the voltage supply transistor 313, an N-type metal-oxide-semiconductor (MOS) transistor is used, for example. As the current source transistor 312, a P-type MOS transistor is used, for example.

The conversion transistor 311 converts a photocurrent $I_{in}$ from the corresponding photodiode 221 into a voltage signal $V_{out}$ and outputs the voltage signal $V_{out}$ from the gate. The source of the conversion transistor 311 is connected to the cathode of the photodiode 221 and the gate of the voltage supply transistor 313 via an input signal line 314. The drain of the conversion transistor 311 is connected to a power source, and the gate is connected to the drain of the current source transistor 312, the drain of the voltage supply transistor 313, and the input terminal of the buffer 320 via an output signal line 315.

The S value (S factor, subthreshold coefficient) of the conversion transistor 311 (an example of a first transistor) is a value larger than the S value of another transistor (an example of a second transistor), for example, at least one transistor included in the output circuit. Details of the S value will be described later.

The current source transistor 312 supplies a predetermined constant current to the output signal line 315. A predetermined bias current Vbias is applied to the gate of the current source transistor 312. The source is connected to the power source, and the drain is connected to the output signal line 315.

The voltage supply transistor 313 supplies a constant voltage corresponding to the constant current from the output signal line 315 to the source of the conversion transistor 311 via the input signal line 314. This stabilizes the source voltage of the conversion transistor 311 to a constant voltage. Thus, when light is incident, the gate-source voltage of the conversion transistor 311 increases according to the photocurrent, and the level of the voltage signal $V_{out}$ increases.

Configuration Example of Subtractor and Quantizer

Figure 8A:
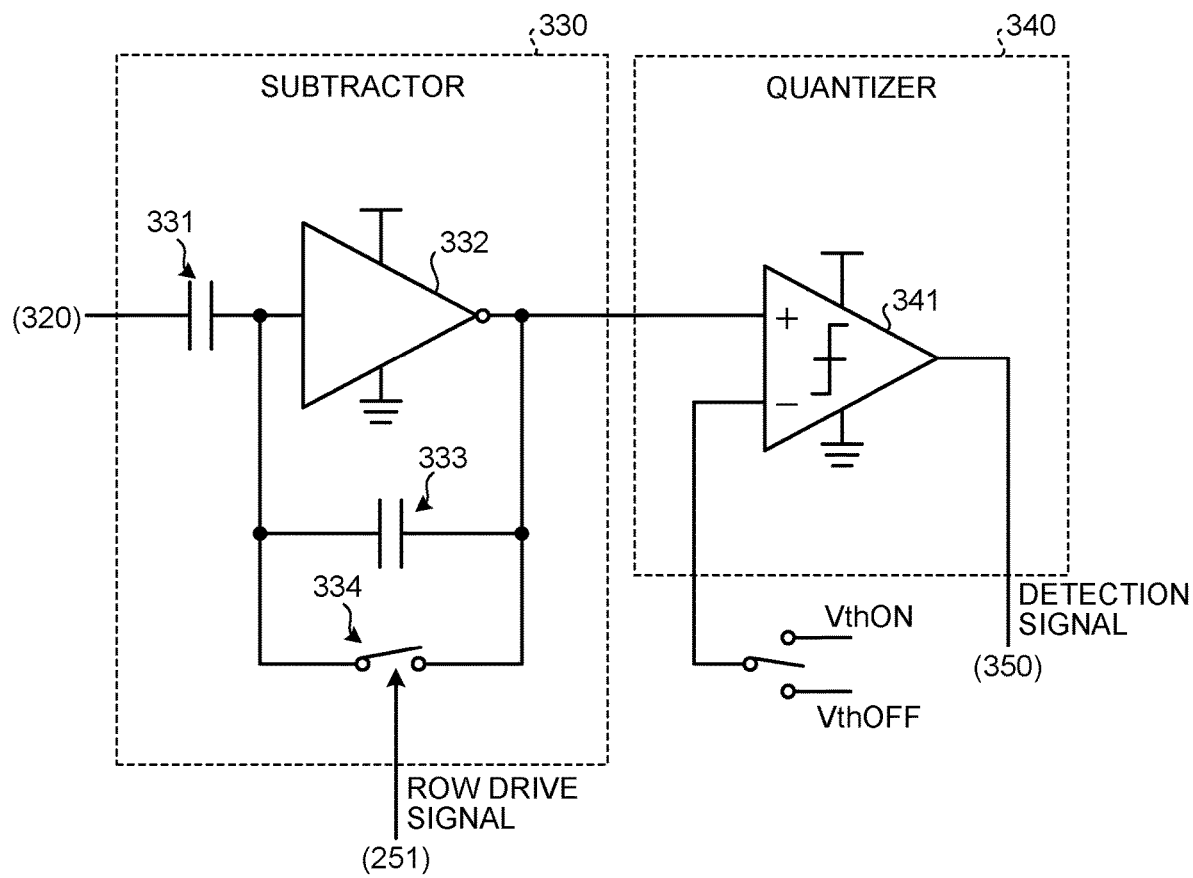
FIG. 8A is a circuit diagram depicting a configuration example of a subtractor and a quantizer according to an embodiment of the present disclosure.

FIG. 8A is a circuit diagram depicting a configuration example of the subtractor 330 and the quantizer 340 according to an embodiment of the present disclosure. The subtractor 330 includes capacitors 331 and 333, an inverter 332, and a switch 334. The quantizer 340 includes a comparator 341.

One end of the capacitor 331 is connected to the output terminal of the buffer 320, and the other end is connected to the input terminal of the inverter 332. The capacitor 333 is connected in parallel to the inverter 332. The switch 334 is formed of, for example, a metal oxide semiconductor field effect transistor (MOSFET), and it opens and closes a path connecting both ends of the capacitor 333 according to the row drive signal. The switch 334 functions as a reset transistor that discharges and resets the capacitor 333 by connecting both ends of the capacitor 333.

The inverter 332 inverts the voltage signal input via the capacitor 331. The inverter 332 outputs the inverted signal to the non-inverting input terminal (+) of the comparator 341.

The comparator 341 is an inverting amplifier, for example, and it functions as a luminance change detection circuit that detects a change in luminance of incident light incident on the photodiode 221 based on the voltage signal input from the subtractor 330.

The comparator 341 compares the voltage signal from the subtractor 330 with predetermined threshold voltages VthON and VthOFF applied to the inverting input terminal (−) to detect the change in luminance of incident light. The comparator 341 outputs a signal indicating the comparison result to the transfer circuit 350 as a detection signal.

For example, when the imaging apparatus 100 is used for face authentication, the comparator 341 switches between the threshold voltages VthON and VthOFF input in synchronization with a blinking cycle of a light source that emits blinking light to a face to be a subject. The comparator 341 compares the input voltage signal with the threshold voltage VthON while the light source is on. The comparator 341 compares the input voltage signal with the threshold voltage VthOFF while the light source is off.

Figure 8B:
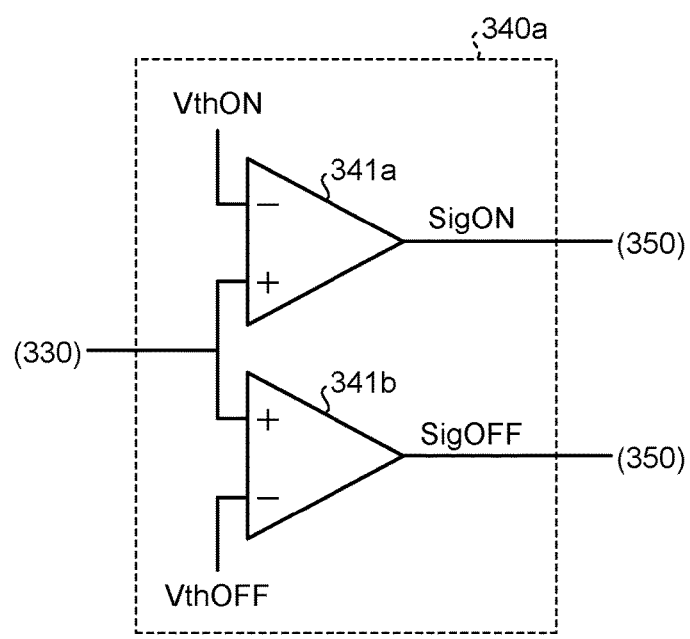
FIG. 8B is a circuit diagram depicting a modification of the quantizer according to an embodiment of the present disclosure.

The configuration of the quantizer 340 is not limited to the configuration illustrated in FIG. 8A, and it may be, for example, the configuration illustrated in FIG. 8B. FIG. 8B is a circuit diagram depicting a modification of the quantizer 340 according to an embodiment of the present disclosure. As illustrated in FIG. 8B, a quantizer 340a according to the modification includes two comparators 341a and 341b connected in parallel to the input.

A voltage signal is input from the subtractor 330 to the non-inverting input terminals (+) of the comparators 341a and 341b. The threshold voltage VthON is input to the inverting input terminal (−) of the comparator 341a. The threshold voltage VthOFF is input to the inverting input terminal (−) of the comparator 341b.

The comparator 341a outputs a detection signal SigON indicating a result of comparison between the voltage signal and the threshold voltage VthON to the transfer circuit 350. The comparator 341b outputs a detection signal SigOFF indicating a result of comparison between the voltage signal and the threshold voltage VthOFF to the transfer circuit 350.

The quantizer 340a having such a configuration can also detect a change in luminance of incident light incident on the photodiode 221 based on the voltage signal input from the subtractor 330 and output the detection result to the transfer circuit 350, in the same manner as the quantizer 340 illustrated in FIG. 8A.

The configuration of the address event detection circuit 300 is not limited to the above-described example. For example, as described above, the address event detection circuit 300 is disposed on the detection chip 202 (see FIG. 4), but the address event detection circuit 300 is not limited to this configuration. A part of the address event detection circuit 300 may be disposed on a chip different from the detection chip 202. For example, the quantizer 340 and the transfer circuit 350 may be disposed on a chip different from the detection chip 202.

A part of the address event detection circuit 300 may be disposed on the light receiving chip 201. For example, the current-voltage conversion circuit 310 and the buffer 320 may be disposed on the light receiving chip 201. For example, a part of the current-voltage conversion circuit 310 may be disposed on the light receiving chip 201, and the rest may be disposed on the detection chip 202.

Figure 9:
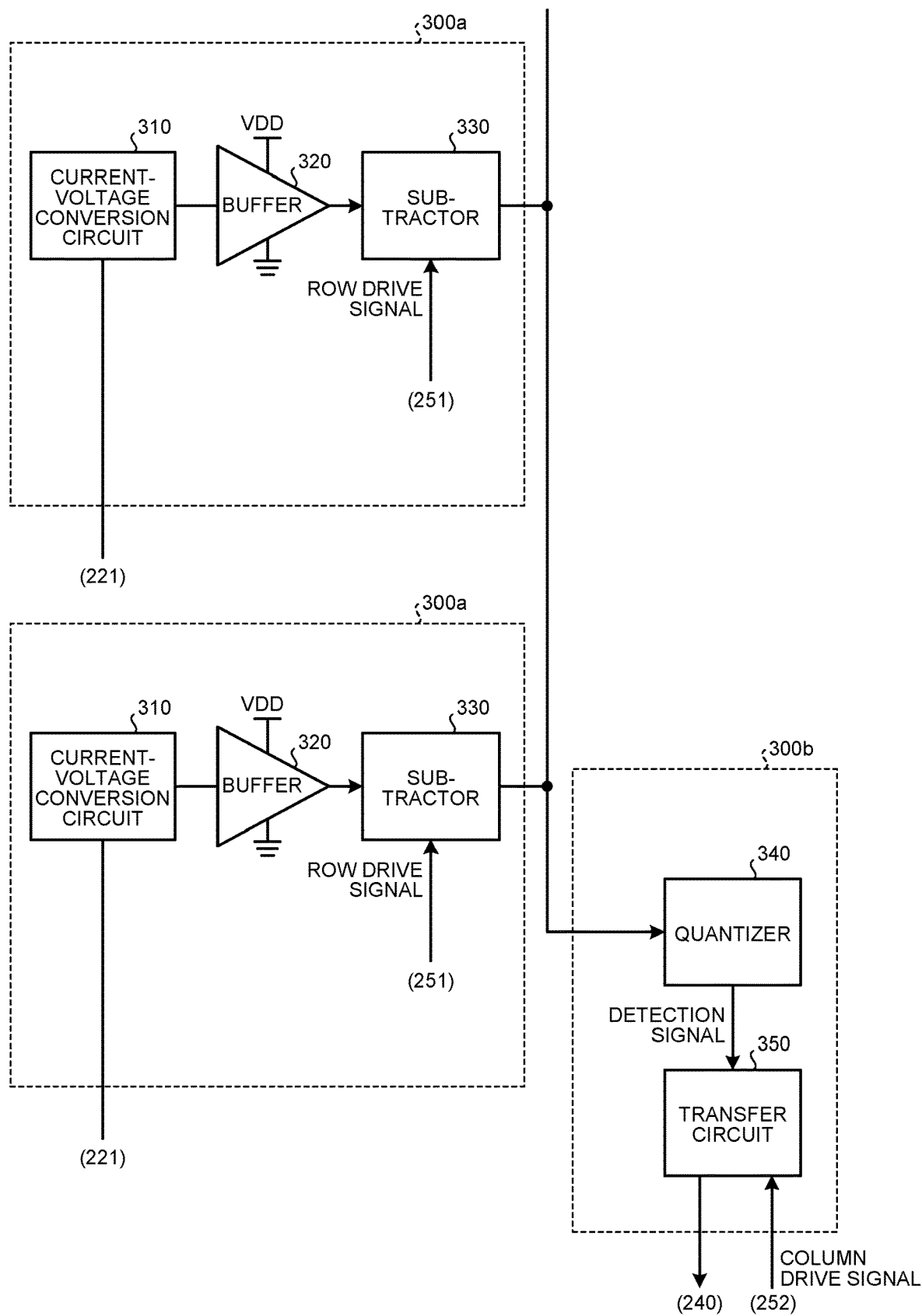
FIG. 9 is a diagram depicting another configuration example of an address event circuit 300 according to an embodiment of the present disclosure.

FIG. 9 is a diagram depicting another configuration example of the address event circuit 300 according to an embodiment of the present disclosure. The address event circuit 300 illustrated in FIG. 9 includes a first address event circuit 300a and a second address event circuit 300b.

The first address event circuit 300a includes, for example, the current-voltage conversion circuit 310, the buffer 320, and the subtractor 330, and it is disposed corresponding to, for example, the photodiode 221. That is, the first address event circuit 300a is disposed on, for example, the detection chip 202 for each pixel.

The second address event circuit 300b includes, for example, the quantizer 340 and the transfer circuit 350, and it is disposed for each of the plurality of first address event circuits 300a (for example, for each column). That is, in FIG. 9, the quantizer 340 and the transfer circuit 350 are shared for each column. For example, the second address event circuit 300b may be disposed between the address event detection unit 260 and the column drive circuit 252 in FIG. 4. In this case, the above-described first address event circuit 300a is disposed in the address event detection unit 260.

A part of the address event circuit 300 may be shared for each column or row in this manner. This configuration can further reduce the circuit scale of the address event circuit 300. The shared circuit and a circuit that is not shared may be disposed on the same chip or may be disposed on different chips.

2. S Value of Transistor

As described above, in the address event detection circuit 300 according to the embodiment of the present disclosure, the conversion transistor 311 has an S value larger than the S values of the other transistors. Hereinafter, the S value of the transistor of the address event detection circuit 300 will be described.

Figure 10:
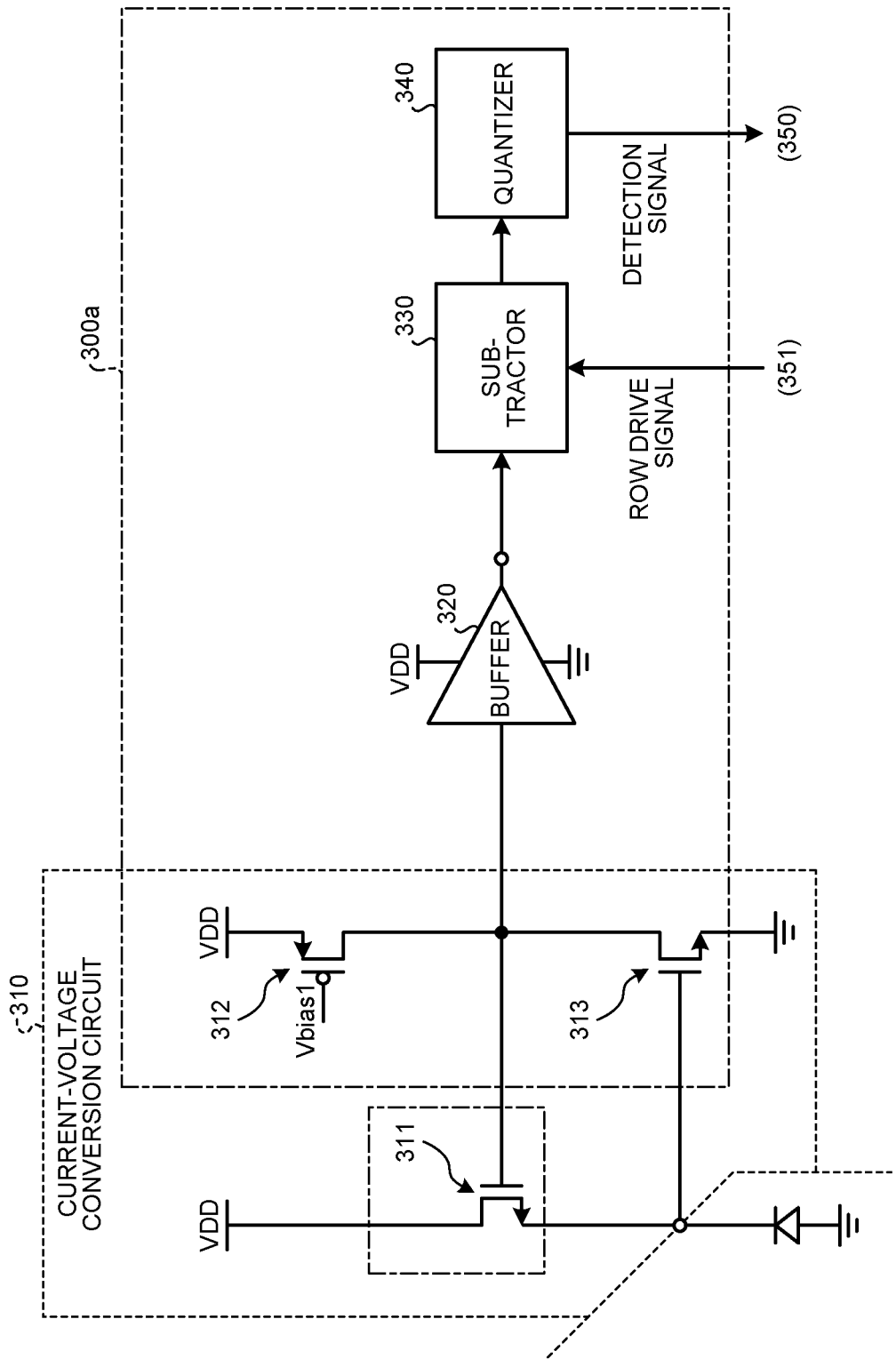
FIG. 10 is a diagram for explaining an S value of a transistor included in the address event detection circuit according to an embodiment of the present disclosure.

FIG. 10 is a diagram for explaining the S value of a transistor included in the address event detection circuit 300 according to the embodiment of the present disclosure.

In an embodiment of the present disclosure, the S value of the conversion transistor 311 is larger than the S values of the transistors included in a remaining circuit 300a. The remaining circuit 300a includes a part of the current-voltage conversion circuit and the above-described output circuit (the buffer 320, the subtractor 330, and the quantizer 340). More specifically, the remaining circuit 300a includes the current source transistor 312 and the voltage supply transistor 313 of the current-voltage conversion circuit 310 in addition to the output circuit (the buffer 320, the subtractor 330, and the quantizer 340).

That is, in the transistors included in the address event detection circuit 300, the S value of the conversion transistor 311 that converts a current into a voltage is larger than the S values of the other transistors.

Figure 11:
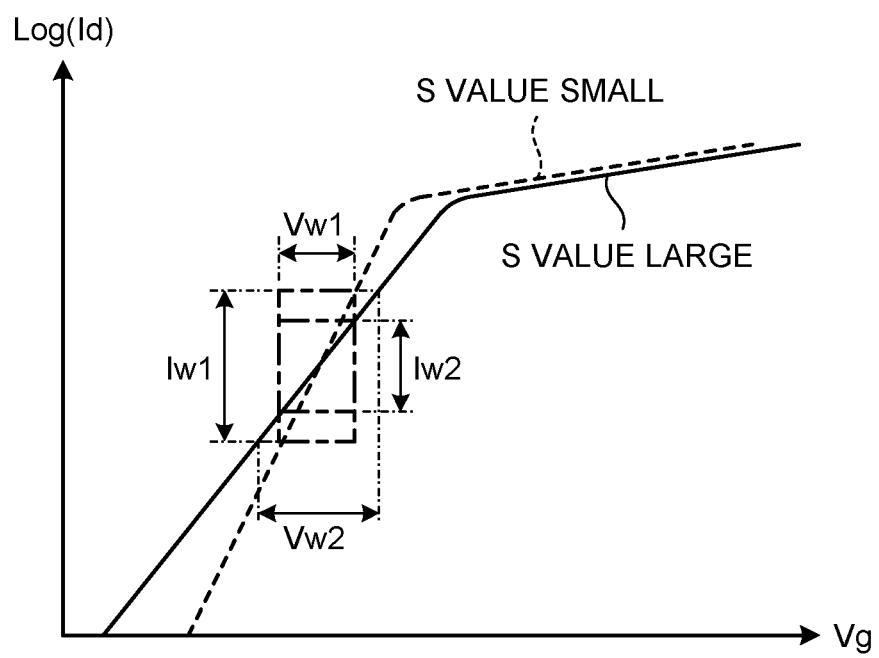
FIG. 11 is a diagram depicting an example of Id-Vg characteristic of a transistor according to an embodiment of the present disclosure.

Here, the S value of a transistor will be described. FIG. 11 is a diagram depicting an example of Id-Vg characteristic of a transistor according to an embodiment of the present disclosure. In FIG. 11, the Id-Vg characteristic of a transistor having a large S value is indicated by a straight line, and the Id-Vg characteristic of a transistor having a small S value is indicated by a chain line. In the following description, the magnitude of the S value of a transistor indicates a relative magnitude relationship between two transistors.

The S value is a gate voltage (Vg) necessary for a drain current Log (Id) to change by one digit in the subthreshold region of the Id-Vg characteristic in which the drain current with respect to the gate voltage is plotted. The S value is represented by a value of a reciprocal of the maximum slope of Log (Id) in the subthreshold region.

As described above, the address event detection circuit 300 according to the embodiment of the present disclosure includes a transistor having a large S value and a transistor having a small S value.

As illustrated in FIG. 11, when the S value is small, the change width Iw1 of the drain current Log (Id) is large with respect to the change width Vw1 of the gate voltage Vg. That is, a transistor having a small S value rapidly switches from an off state to an on state, and thus it has high switching property. On the other hand, when the S value is large, the change width Iw2 of the drain current Log (Id) is small with respect to the change width Vw1 of the gate voltage Vg, and the switching property is low.

Thus, when the transistor is operated as a switch, the S value of the transistor is preferably small to obtain high switching property.

In terms of the change width of the gate voltage with respect to the drain current, when the S value is small, the change width Vw1 of the gate voltage Vg is smaller than the change width Iw2 when the S value is large with respect to the change width Iw1 of the drain current Log (Id).

Thus, when a transistor having a small S value is used as the conversion transistor 311 of the current-voltage conversion circuit 310, the conversion gain in converting a photocurrent into a voltage becomes small.

In the address event detection circuit 300 according to a first embodiment of the present disclosure, the S value of the conversion transistor 311 is made smaller than those of the other transistors. This configuration can increase the conversion gain in converting a photocurrent into a voltage. In addition, the conversion gain can be increased while preventing an increase in the circuit area, since the conversion gain in converting a photocurrent into a voltage can be increased without adding a transistor. Further, pixels can be miniaturized since the conversion gain can be increased while preventing an increase in the circuit area. The current-voltage conversion circuit 310 can be optimally designed since the conversion gain can be adjusted by adjusting the S value.

For example, as will be described later with reference to FIG. 25, the conversion gain may be adjusted by connecting N conversion transistors 311 in series. Connecting N conversion transistors 311 in series increases the conversion gain by N times. In the method of connecting the conversion transistors 311 in series, the conversion gain is adjusted by an integral multiple of the gain of the conversion transistor 311 like this. On the other hand, in the address event circuit 300 according to the first embodiment of the present disclosure, the conversion gain is adjusted by adjusting the S value of the conversion transistor 311. When the S value is adjusted in this manner, the conversion gain can be adjusted to any values other than an integral multiple of the gain of the conversion transistor 311. Thus, the conversion gain of the current-voltage conversion circuit 310 can be more easily optimized.

(Method of Adjusting S Value) Next, a method of adjusting the S values of transistors will be described with reference to FIGS. 12, 13, 14A, 14B, 15A, 15B, 16A, 16B, 17A, 17B, 18, 19, 20, and 21.

First, a method of adjusting the S values in transistors having the same structure will be described.

FIG. 12 is a table for explaining a relationship between the S value and transistors according to the embodiment of the present disclosure.

As illustrated in FIG. 12, when transistors having a bulk structure are used as a transistor having a small S value and a transistor having a large S value, the configuration of the transistor illustrated in FIG. 13 is exemplified as a method of adjusting the S value. FIG. 13 is a table for explaining the method of adjusting the S value in a transistor having a bulk structure according to the embodiment of the present disclosure.

(Gate Length)

As illustrated in FIG. 13, as a method of adjusting the S value in a transistor having a bulk structure, there is a method of adjusting the gate length of the transistor. For example, when the gate length of the transistor is longer, the S value is smaller than that when the gate length is shorter.

Figure 14A:
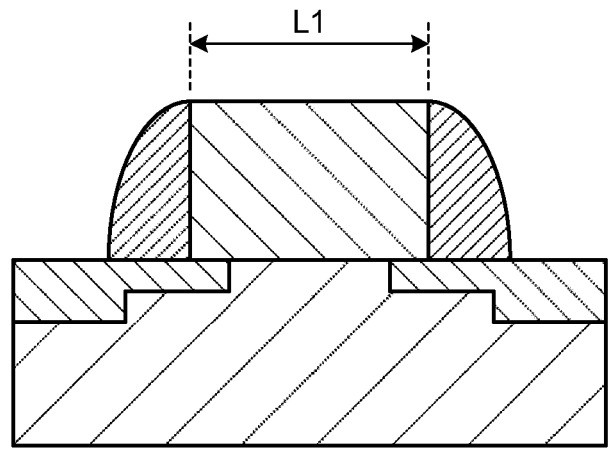
FIGS. 14A and 14B are schematic diagrams for explaining an example of a sectional structure of the transistor according to an embodiment of the present disclosure.
Figure 14B:
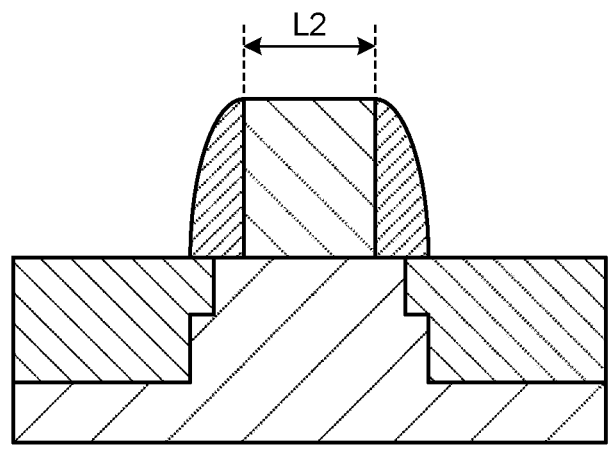

FIGS. 14A and 14B are schematic diagrams for explaining an example of a sectional structure of the transistor according to the embodiment of the present disclosure. FIGS. 14A and 14B are schematic diagrams and is not necessarily strictly illustrated. FIGS. 14A and 14B illustrate a sectional structure between the source and the drain of the transistor. FIGS. 14A and 14B also illustrate an example of a transistor having a planar structure.

The gate length L1 of the transistor of FIG. 14A is longer than the gate length L2 of the transistor of FIG. 14B. In this case, the S value of the transistor of FIG. 14A is smaller than that of the transistor of FIG. 14B.

The S value of the transistor may be adjusted by adjusting the gate length of the transistor in this manner. That is, making the gate length of the conversion transistor 311 shorter than the gate lengths of the other transistors causes the S value of the conversion transistor 311 to be larger than the S values of the other transistors.

(Channel Doping)

The description returns to FIG. 13. For example, as a method of adjusting the S value, there is a method of changing the method of forming a channel region in a transistor having a bulk planar structure. For example, the S value becomes smaller with normal channel doping in which ion implantation of a p-type impurity is performed on an n-type transistor to form a channel region than with counter doping in which ion implantation of an n-type impurity is performed on the n-type transistor to form the channel region. In other words, when the channel region is formed by performing ion implantation of an impurity of a second polarity different from the polarity of the transistor, which is a first polarity, the S value of the transistor becomes smaller than when the channel region is formed by performing ion implantation of an impurity of the same first polarity.

That is, forming the channel region of the conversion transistor 311 with counter doping and forming the channel regions of the other transistors by normal channel doping causes the S value of the conversion transistor 311 to be larger than the S values of the other transistors.

(S/D Depth and S/D Concentration)

Further, for example, as a method of adjusting the S value, there is a method of adjusting the source-drain (S/D) depth and the source-drain concentration in a transistor having a bulk planar structure. The S value of a transistor having a small source-drain depth and a low source-drain concentration is smaller than the S value of a transistor having a large source-drain depth and a high source-drain concentration.

That is, the S value of the conversion transistor 311 becomes larger than the S values of the other transistors by making the conversion transistor 311 have a large source-drain depth and a high source-drain concentration and making other transistors have a small source-drain depth and a low source-drain concentration.

(Thickness of SW)

For example, as a method of adjusting the S value, there is a method of adjusting the thickness of a sidewall (SW) in a transistor having a bulk planar structure. The S value of the transistor having a thick sidewall is smaller than the S value of the transistor having a thin sidewall.

That is, making the sidewall of the conversion transistor 311 thin and the sidewalls of the other transistors thick causes the S value of the conversion transistor 311 to be larger than the S values of the other transistors.

(Bias)

For example, as a method of adjusting the S value, there is a method of adjusting the S value by a method of applying a voltage to a body terminal in a transistor having a bulk planar structure. For example, the S value becomes smaller with a forward bias in which a forward voltage is applied to the body terminal of the transistor than with a back bias in which a reverse voltage is applied.

That is, applying a forward voltage to the body terminal of the conversion transistor 311 (forward bias) and applying a reverse voltage to the body terminals of the other transistors (back bias) causes the S value of the conversion transistor 311 to be larger than the S values of the other transistors.

(Thickness of Device Region Layer)

The description returns to FIG. 12. As a method of adjusting the S value, there is a method of adjusting it with a depth where an embedded insulating layer of a SOI substrate is provided (that is, the thickness of the device region layer). For example, the smaller the thickness of the device region layer of the transistor, the smaller the S value as compared with the case where the device region layer is thick.

Figure 15A:
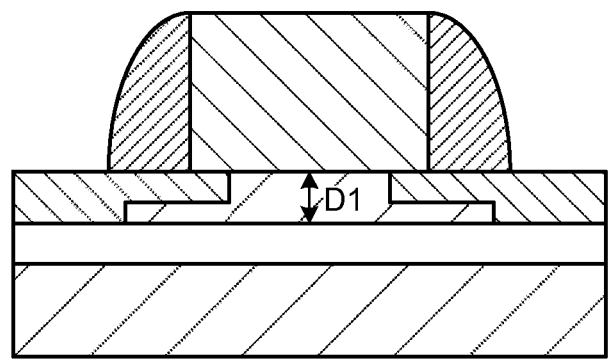
FIGS. 15A and 15B are schematic diagrams for explaining an example of a sectional structure of the transistor according to an embodiment of the present disclosure.
Figure 15B:
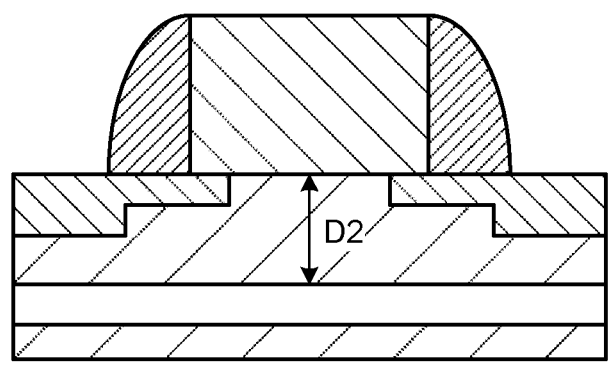

FIGS. 15A and 15B are schematic diagrams for explaining an example of a sectional structure of a transistor according to the embodiment of the present disclosure. FIGS. 15A and 15B are schematic diagrams and is not necessarily strictly illustrated. FIGS. 15A and 15B illustrate a sectional structure between the source and the drain of the transistor. FIGS. 15A and 15B also illustrate an example of a transistor having a planar structure.

The thickness D1 of the device region layer of the transistor of FIG. 15A is smaller than the thickness D2 of the device region layer of the transistor of FIG. 15B. In this case, the S value of the transistor of FIG. 15A is smaller than that of the transistor of FIG. 15B.

The S value of the transistor may be adjusted by adjusting the thickness of the device region layer of the transistor like this. That is, making the thickness of the device region layer of the conversion transistor 311 larger than the thicknesses of the device region layers of the other transistors causes the S value of the conversion transistor 311 to be larger than the S values of the other transistors.

As illustrated in FIG. 12, the SOI substrate having a thick device region layer may be a so-called fully depleted silicon on insulator (FDSOI) substrate. The SOI substrate having a thin device region layer may be a so-called partially depleted silicon on insulator (PDSOI) substrate.

The S value may be changed according to the depth where the embedded insulating layer of the SOI substrate forming the transistor is provided like this.

(Fin Width)

When transistors having a FinFET structure are used as a transistor having a small S value and a transistor having a large S value, a method of adjusting the width (fin width) of a fin part may be exemplified as a method of adjusting the S value.

Figure 16A:
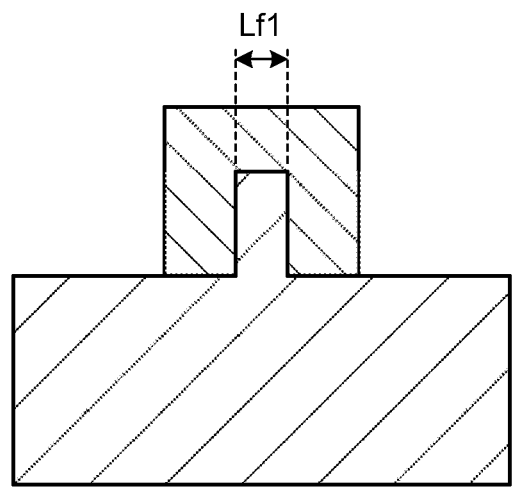
FIGS. 16A and 16B are schematic diagrams for explaining an example of a sectional structure of the transistor according to an embodiment of the present disclosure.
Figure 16B:
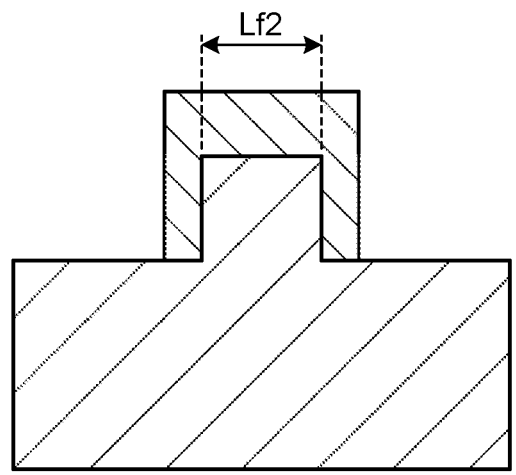

FIGS. 16A and 16B are schematic diagrams for explaining an example of a sectional structure of a transistor according to the embodiment of the present disclosure. FIGS. 16A and 16B are schematic diagrams and is not necessarily strictly illustrated. FIGS. 16A and 16B illustrate a sectional structure between the source and the drain of the transistor.

In a transistor having a FinFET structure, a semiconductor substrate includes a fin part formed to protrude in a fin shape, and a channel formation region is formed in the fin part below the gate electrode.

The Si thickness of the fin part of the transistor of FIG. 16A, that is, the width Lf1 of the fin part is thinner than the width Lf2 of the fin part of the transistor of FIG. 16B. In this case, the S value of the transistor of FIG. 16A is smaller than that of the transistor of FIG. 16B.

The S value of the transistor may be adjusted by adjusting the fin width of the transistor in this manner. That is, making the fin width of the conversion transistor 311 larger than the fin widths of the other transistors causes the S value of the conversion transistor 311 to be larger than the S values of the other transistors.

(GAA Thickness)

The description returns to FIG. 12. When transistors having a gate-all-around (GAA) structure are used as a transistor having a small S value and a transistor having a large S value, a method of adjusting the thickness (hereinafter, also referred to as GAA thickness) of a channel may be exemplified as a method of adjusting the S value.

Figure 17A:
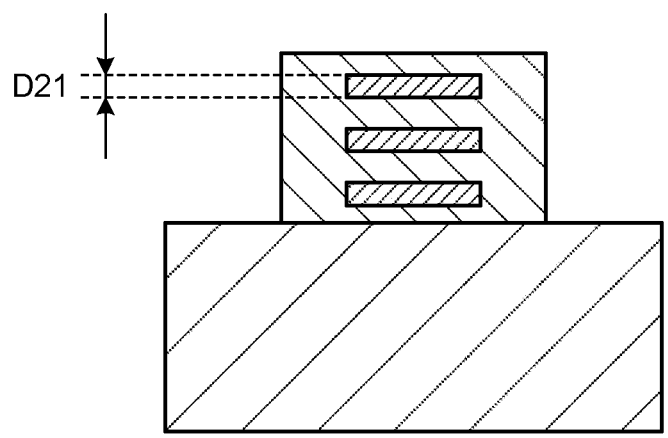
FIGS. 17A and 17B are schematic diagrams for explaining an example of a sectional structure of the transistor according to an embodiment of the present disclosure.
Figure 17B:
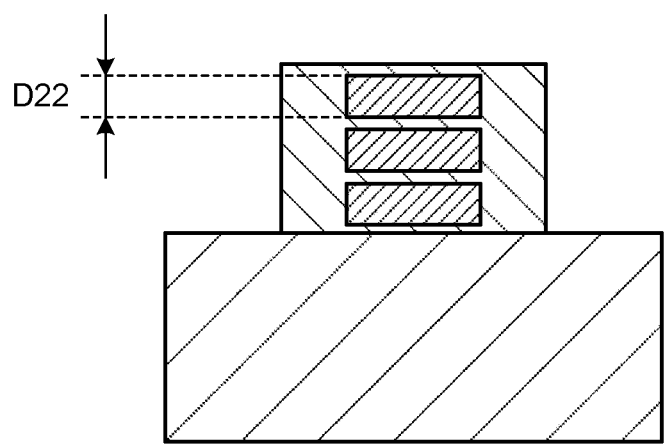

FIGS. 17A and 17B are schematic diagrams for explaining an example of a sectional structure of a transistor according to the embodiment of the present disclosure. FIGS. 17A and 17B are schematic diagrams and is not necessarily strictly illustrated. FIGS. 17A and 17B illustrate a sectional structure in a direction perpendicular to the source and the drain of the transistor.

The transistor having the GAA structure is an all-around transistor in which a gate electrode is connected to a channel on four surfaces. A thickness of the channel in a direction perpendicular to the substrate is defined as a GAA thickness.

The GAA thickness D21 of the transistor of FIG. 17A is smaller than the GAA thickness D22 of the transistor of FIG. 17B. In this case, the S value of the transistor of FIG. 17A is smaller than that of the transistor of FIG. 17B.

The S value of the transistor may be adjusted by adjusting the GAA thickness of the transistor in this manner. That is, making the GAA thickness of the conversion transistor 311 larger than the GAA thicknesses of the other transistors causes the S value of the conversion transistor 311 to be larger than the S values of the other transistors.

In the methods of adjusting the S value described above, the transistors included in the address event detection circuit 300 have the same structure, but the transistors are not limited to this configuration. For example, the transistors included in the address event detection circuit 300 may have different structures. That is, for example, the address event detection circuit 300 according to the first embodiment of the present disclosure may change the S value of the transistor by changing the structure of the transistors.

For example, in the above-described structure, the S value decreases in the order of the GAA structure, the FinFET structure, the FDSOI substrate structure, the bulk planar structure, and the PDSOI substrate structure. Thus, by selecting the structure according to the S value of each transistor, the S values of the conversion transistor 311 and the other transistors included in the address event detection circuit 300 may be adjusted.

This is the order when the structures are compared under predetermined conditions, and the order may change depending on various sizes such as the gate length and materials.

FIG. 18 is a table for explaining a relationship between the S value and transistors according to the embodiment of the present disclosure.

(Bulk/PDSOI)

As illustrated in FIG. 18, for example, the S value of a transistor having a bulk structure (or a bulk planar structure) may be smaller than that of a transistor having a PDSOI substrate structure. Thus, for example, the conversion transistor 311 is formed to have a PDSOI substrate structure, and the other transistors are formed to have a bulk structure. This configuration allows the address event detection circuit 300 to have the S value of the conversion transistor 311 larger than the S values of the other transistors.

(FDSOI/Bulk)

For example, the S value of a transistor having a FDSOI substrate structure may be smaller than that of a transistor having a bulk structure. Therefore, for example, the conversion transistor 311 has a bulk structure, and the other transistors have a FDSOI substrate structure. This configuration allows the address event detection circuit 300 to have the S value of the conversion transistor 311 larger than the S values of the other transistors.

(FDSOI/FinFET)

Figure 19:
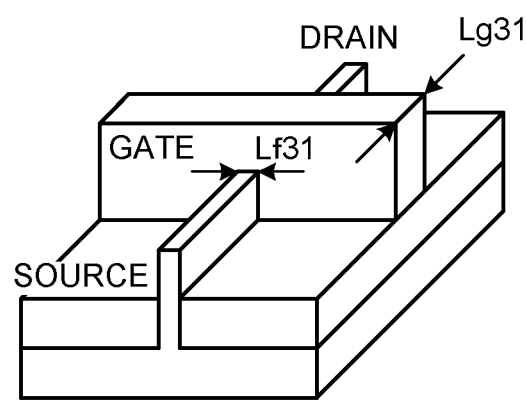
FIG. 19 is a schematic diagram depicting an example of a transistor having a FinFET structure according to an embodiment of the present disclosure.

For example, the S value of a transistor having a FDSOI substrate structure may be smaller than that of a transistor having a FinFET structure. However, in this case, in the transistor having a FinFET structure, the fin width Lf31 illustrated in FIG. 19 is larger than ⅓ of the gate length Lg31. FIG. 19 is a schematic diagram depicting an example of a transistor having a FinFET structure according to the embodiment of the present disclosure. FIG. 19 is a schematic diagram and is not necessarily strictly illustrated.

The conversion transistor 311 is formed to have the above-described FinFET structure, and the other transistors are formed to have a FDSOI substrate structure. This configuration allows the address event detection circuit 300 to have the S value of the conversion transistor 311 larger than the S values of the other transistors.

(FDSOI/GAA)

Figure 20:
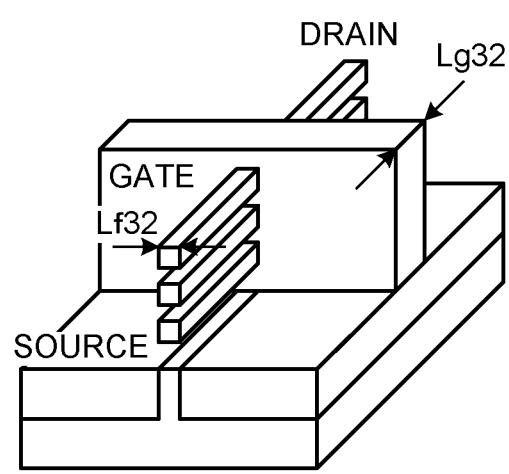
FIG. 20 is a schematic diagram depicting an example of a transistor having a GAA structure according to an embodiment of the present disclosure.

The description returns to FIG. 18. For example, the S value of a transistor having a FDSOI substrate structure may be smaller than that of a transistor having a GAA structure. However, in this case, in the transistor having a GAA structure, the GAA width Lf32 illustrated in FIG. 20 is larger than ½ of the gate length Lg32. FIG. 20 is a schematic diagram depicting an example of a transistor having a GAA structure according to the embodiment of the present disclosure. FIG. 20 is a schematic diagram and is not necessarily strictly illustrated.

The conversion transistor 311 is formed to have the above-described GAA structure, and the other transistors are formed to have a FDSOI substrate structure. This configuration allows the address event detection circuit 300 to have the S value of the conversion transistor 311 larger than the S values of the other transistors.

(FinFET/Bulk)

The description returns to FIG. 18. For example, the S value of a transistor having a FinFET structure may be smaller than that of a transistor having a Bulk structure. However, in this case, in the transistor having a FinFET structure, the fin width Lf31 is smaller than ⅓ of the gate length Lg31 (see FIG. 19).

The conversion transistor 311 is formed to have a bulk structure, and the other transistors are formed to have the above-described FinFET structure. This configuration allows the address event detection circuit 300 to have the S value of the conversion transistor 311 larger than the S values of the other transistors.

(FinFET/PDSOI)

For example, the S value of a transistor having a FinFET structure may be smaller than that of a transistor having a PDSOI substrate structure. However, in this case, in the transistor having a FinFET structure, the fin width Lf31 is smaller than ⅓ of the gate length Lg31 (see FIG. 19).

The conversion transistor 311 is formed to have a PDSOI substrate structure, and the other transistors are formed to have the above-described FinFET structure. This configuration allows the address event detection circuit 300 to have the S value of the conversion transistor 311 larger than the S values of the other transistors.

(FinFET/GAA)

For example, the S value of a transistor having a FinFET structure may be smaller than that of a transistor having a GAA structure. However, in this case, in the transistor having a FinFET structure, the fin width Lf31 is smaller than ⅓ of the gate length Lg31 (see FIG. 19). In the transistor having a GAA structure, the GAA width Lf32 is larger than ½ of the gate length Lg32 (see FIG. 20).

The conversion transistor 311 is formed to have the above-described GAA structure, and the other transistors are formed to have the above-described FinFET structure. This configuration allows the address event detection circuit 300 to have the S value of the conversion transistor 311 larger than the S values of the other transistors.

(GAA/Bulk)

For example, the S value of a transistor having a GAA structure may be smaller than that of a transistor having a Bulk structure. However, in this case, in the transistor having a GAA structure, the GAA width Lf32 is smaller than ½ of the gate length Lg32 (see FIG. 20).

The conversion transistor 311 is formed to have a bulk structure, and the other transistors are formed to have the above-described GAA structure. This configuration allows the address event detection circuit 300 to have the S value of the conversion transistor 311 larger than the S values of the other transistors.

(GAA/PDSOI)

For example, the S value of a transistor having a GAA structure may be smaller than that of a transistor having a PDSOI substrate structure. However, in this case, in the transistor having a GAA structure, the GAA width Lf32 is smaller than ½ of the gate length Lg32 (see FIG. 20).

The conversion transistor 311 is formed to have a PDSOI substrate structure, and the other transistors are formed to have the above-described GAA structure. This configuration allows the address event detection circuit 300 to have the S value of the conversion transistor 311 larger than the S values of the other transistors.

(GAA/FinFET)

For example, the S value of a transistor having a GAA structure may be smaller than that of a transistor having a FinFET structure. However, in this case, in the transistor having a FinFET structure, the fin width Lf31 is larger than ⅓ of the gate length Lg31 (see FIG. 19). In the transistor having a GAA structure, the GAA width Lf32 is smaller than ½ of the gate length Lg32 (see FIG. 20).

The conversion transistor 311 is formed to have the above-described FinFET structure, and the other transistors are formed to have the above-described GAA structure. This configuration allows the address event detection circuit 300 to have the S value of the conversion transistor 311 larger than the S values of the other transistors.

(Others)

The above-described methods for adjusting the S value are examples, and the address event detection circuit 300 may adjust the S value by another method. For example, the S value is adjusted by adjusting the gate length in a transistor having a bulk structure, but the S value may also be adjusted by adjusting the gate length in a transistor having another structure.

In a transistor having a metal gate (MG)/high-k (HK) structure, the S value may be adjusted by adjusting a work function of a gate electrode or formation of a dipole. At this time, for example, the S value near 0 V may be reduced by shifting a forward bias voltage Vfb to a band edge, or by shifting the forward bias voltage Vfb by the dipole control of the MG/HK. That is, a low Vt may be realized in using the transistor as a switch.

The S value may be reduced and a low Vt may be realized in a FDSOI substrate structure by applying a forward bias to a body terminal of the transistor. For example, a forward voltage is applied to an N-well under a buried oxide (BOX) layer of an NMOS transistor. Alternatively, a back bias may be applied positively with a thin film buried oxide silicon on insulator (BOXSOI).

Alternatively, the S value may be adjusted by combining a plurality of structures. For example, a MG/HK structure and a FDSOI substrate structure may be combined. Alternatively, a MG/HK structure and a FinFET structure or a GAA structure may be combined. This configuration can reduce the S value with the fully depleted device structure (FDSOI substrate structure, FinFET structure, or GAA structure) while realizing a low Vt with the MG/HK structure.

Alternatively, the S value may be made smaller than that of the conversion transistor 311 by using a tunnel field-effect transistor (TFET) as another transistor of the address event detection circuit 300. In the TFET, the S value is equal to or larger than that of Si (<60 m/dec).

As the other transistors of the address event detection circuit 300, a transistor in which a negative capacitance FET (NCFET) and a MG/HK structure are combined may be used. Combining a NCFET and a MG/HK structure can also make the S value of another transistor smaller than that of the conversion transistor 311.

In the method for adjusting the S value described above, the case where the transistor has the FinFET structure or the GAA structure has been described, but the method is not limited to these structures. The transistor may be, for example, a multi-gate transistor such as a tri-gate transistor.

Figure 21:
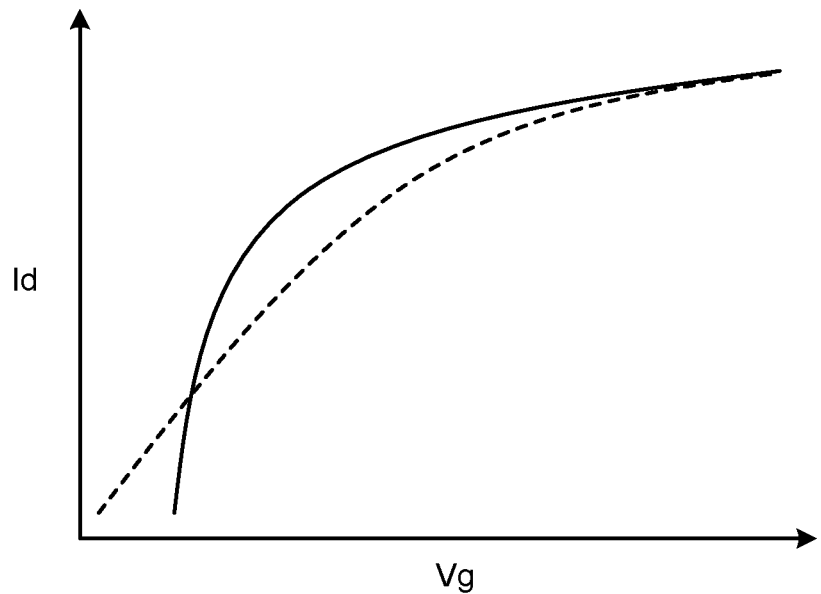
FIG. 21 is a diagram for explaining an Id-Vg characteristic of the transistor of the address event detection circuit according to an embodiment of the present disclosure.

Adjusting the S value in this manner can make the S value of the conversion transistor 311 as a transistor included in the address event detection circuit 300 larger than the S values of the other transistors as illustrated in FIG. 21, for example. FIG. 21 is a diagram for explaining the Id-Vg characteristic of the transistor of the address event detection circuit 300 according to the embodiment of the present disclosure. In FIG. 21, the Id-Vg characteristic of the conversion transistor 311 is plotted by a chain line, and the Id-Vg characteristic of the other transistors are plotted by a solid line.

3. Modification

In the above-described embodiment, the current-voltage conversion circuit 310 includes the conversion transistor 311, the current source transistor 312, and the voltage supply transistor 313, but the current-voltage conversion circuit 310 is not limited to this configuration. Hereinafter, modifications of the current-voltage conversion circuit 310 according to the first embodiment of the present disclosure will be described with reference to FIGS. 22 to 25.

Figure 22:
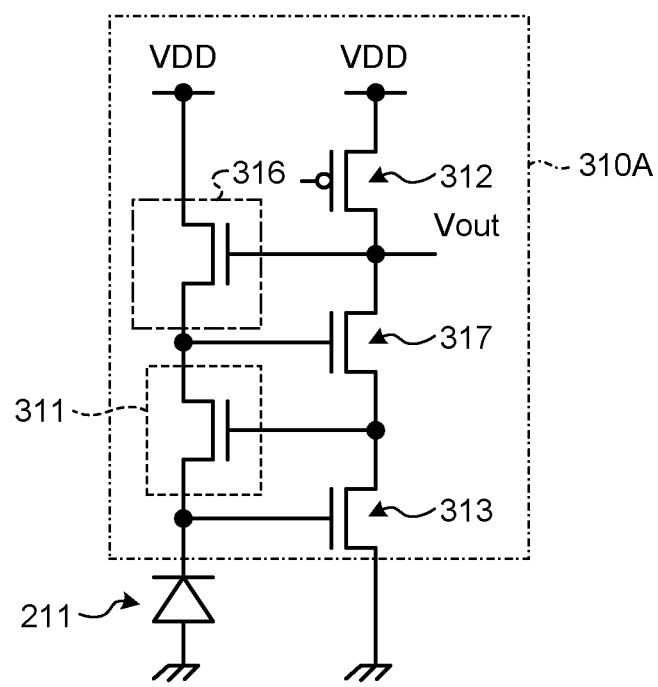
FIG. 22 is a circuit diagram depicting a configuration example of a current-voltage conversion circuit according to a modification of an embodiment of the present disclosure.

FIG. 22 is a circuit diagram illustrating a configuration example of a current-voltage conversion circuit 310A according to a modification of the embodiment of the present disclosure. As illustrated in FIG. 22, the current-voltage conversion circuit 310A includes, for example, a so-called gain boost circuit configuration in which a second conversion transistor 316 connected in series between the conversion transistor 311 and the power source line and a second voltage supply transistor 317 connected in series between the voltage supply transistor 313 and the current source transistor 312 are added to the source follower circuit configuration illustrated in FIG. 7.

The photocurrent from the photodiode 221 can be converted into the logarithmic voltage signal $V_{out}$ according to the charge amount also when the gain boost current-voltage conversion circuit 310A is used like this.

In this case, the S values of the conversion transistor 311 and the second conversion transistor 316 are set to values larger than the S values of the other transistors of the address event detection circuit 300. The conversion gain of the current-voltage conversion circuit 310A can be further increased by connecting transistors having large conversion gains in multiple stages like this.

Figure 23:
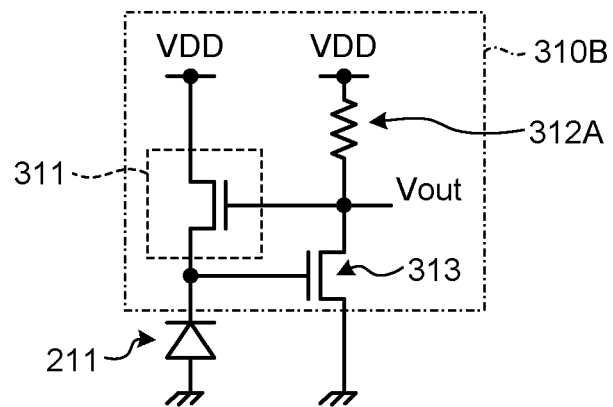
FIG. 23 is a circuit diagram depicting a configuration example of a current-voltage conversion circuit according to a modification of an embodiment of the present disclosure.

FIG. 23 is a circuit diagram illustrating a configuration example of a current-voltage conversion circuit 310B according to a modification of the embodiment of the present disclosure. As illustrated in FIG. 23, the current-voltage conversion circuit 310B includes a load circuit 312A instead of the current source transistor 312 illustrated in FIG. 7. The photocurrent from the photodiode 221 can be converted into a logarithmic voltage signal $V_{out}$ corresponding to the charge amount also in the circuit configuration illustrated in FIG. 23.

The conversion gain of the current-voltage conversion circuit 310B can be further increased by setting the S value of the conversion transistor 311 to a value larger than the S values of the other transistors of the address event detection circuit 300.

Figure 24:
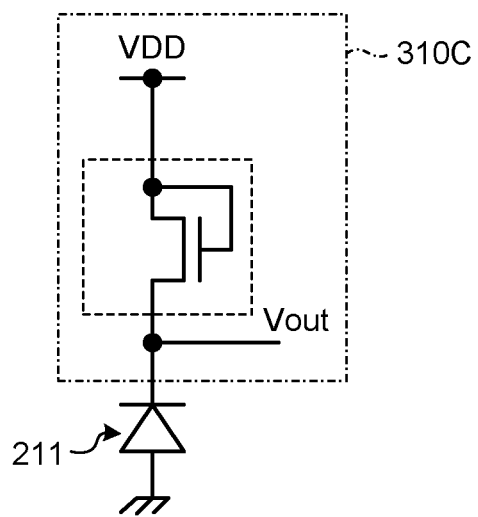
FIG. 24 is a circuit diagram depicting a configuration example of a current-voltage conversion circuit according to a modification of an embodiment of the present disclosure.

FIG. 24 is a circuit diagram illustrating a configuration example of a current-voltage conversion circuit 310C according to a modification of the embodiment of the present disclosure. The current-voltage conversion circuit 310C of FIG. 24 is different from the current-voltage conversion circuit 310 of FIG. 7 in that it includes a conversion transistor 311A and does not include the current source transistor 312 or the voltage supply transistor 313.

As illustrated in FIG. 24, the gate of the conversion transistor 311A is connected to the source. The conversion transistor 311A converts the photocurrent $I_{in}$ from the photodiode 221 into the voltage signal $V_{out}$ and outputs the voltage signal $V_{out}$ from the drain.

The conversion gain of the current-voltage conversion circuit 310C can be further increased by setting the S value of the conversion transistor 311A to a value larger than the S values of the other transistors of the address event detection circuit 300 also in the circuit configuration illustrated in FIG. 24.

Figure 25:
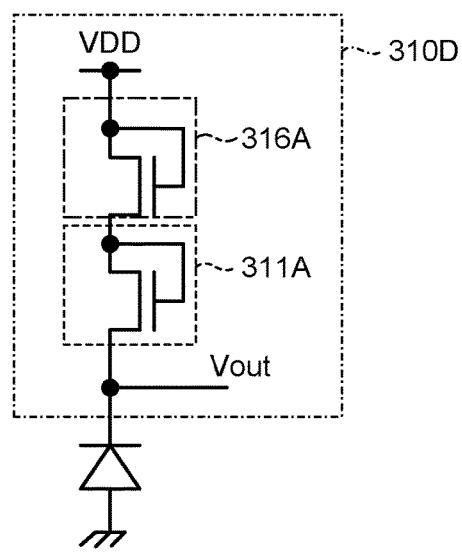
FIG. 25 is a circuit diagram depicting a configuration example of a current-voltage conversion circuit according to a modification of an embodiment of the present disclosure.

FIG. 25 is a circuit diagram illustrating a configuration example of a current-voltage conversion circuit 310D according to a modification of the embodiment of the present disclosure. As illustrated in FIG. 25, the current-voltage conversion circuit 310D has, for example, a so-called gain boost circuit configuration in which a second conversion transistor 316A connected in series between the conversion transistor 311A and the power source line is added to the circuit configuration illustrated in FIG. 24.

The photocurrent from the photodiode 221 can be converted into the logarithmic voltage signal $V_{out}$ according to the charge amount also when the gain boost current-voltage conversion circuit 310D is used like this.

In this case, the S values of the conversion transistor 311A and the second conversion transistor 316A are set to values larger than the S values of the other transistors of the address event detection circuit 300. The conversion gain of the current-voltage conversion circuit 310D can be further increased by connecting transistors having large conversion gains in multiple stages like this.

In the above-described embodiment, the S value of the conversion transistor 311 in the address event detection circuit 300 is larger than the S values of the other transistors included in the remaining circuit 300a (see FIG. 10), but the present disclosure is not limited to this configuration.

For example, of the plurality of transistors included in the remaining circuit 300a, the S values of all the transistors may be smaller than that of the conversion transistor 311, or the S values of at least some of the transistors may be smaller. When the S values of at least some of the transistors are set to a value smaller than the S value of the conversion transistor 311, it is desirable to set the S value of the transistor used as an amplifier circuit to a value smaller than the S value of the conversion transistor 311.

Figure 26:
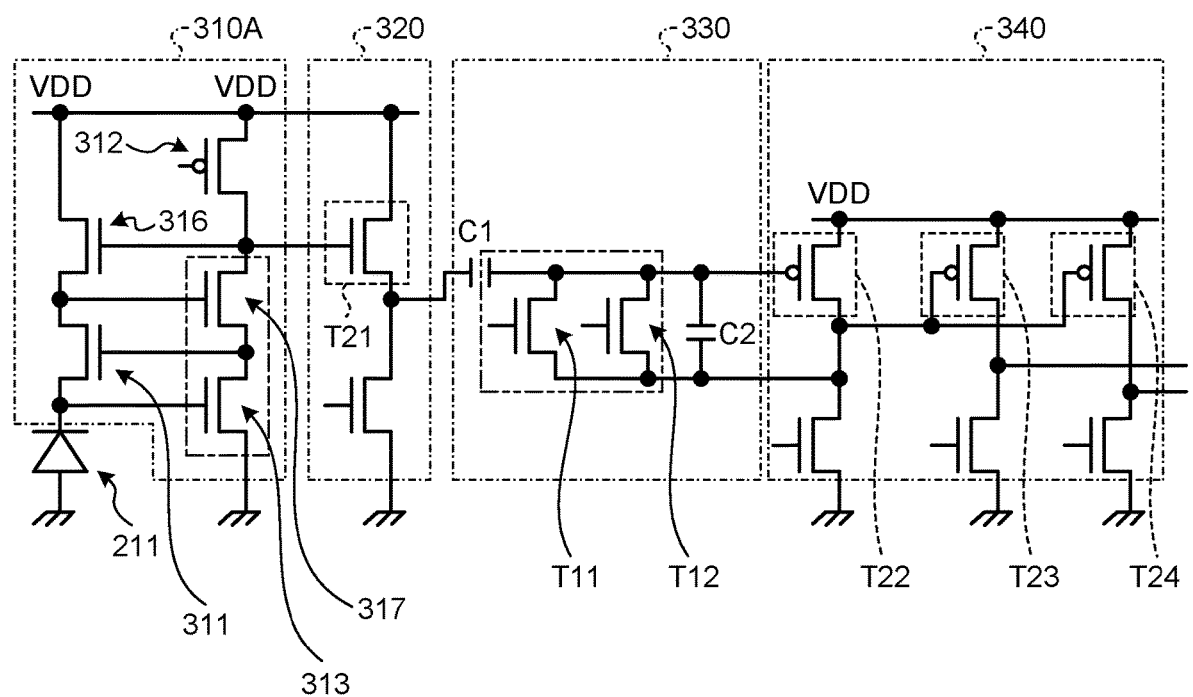
FIG. 26 is a circuit diagram depicting another configuration example of the address event detection circuit according to an embodiment of the present disclosure.

FIG. 26 is a circuit diagram illustrating another configuration example of the address event detection circuit 300 according to the embodiment of the present disclosure. FIG. 26 illustrates a case where the address event detection circuit 300 includes the current-voltage conversion circuit 310A illustrated in FIG. 22.

Since a plurality of transistors T11 and T12 included in the subtractor 330 in the address event detection circuit 300 operate as an amplifier circuit of the subtractor 330, it is desirable to set the S values of the transistors to values smaller than the S value of the conversion transistor 311.

Then, the S values of a transistor T21 included in the buffer 320 and connected to the output of the current-voltage conversion circuit 310A and a plurality of pMOS transistors T22 to T24 included in the quantizer 340 are desirably set to values smaller than the S value of the conversion transistor 311.

It is desirable that the voltage supply transistor 313 and the second voltage supply transistor 317 included in the current-voltage conversion circuit 310A have S values smaller than the S value of the conversion transistor 311 with the priority next to the buffer 320 and the quantizer 340.

That is, the transistors T11 and T12 included in the subtractor 330 have the highest priority among the transistors that make the S value smaller than that of the conversion transistor 311 in the address event detection circuit 300. Then, the transistor T21 included in the buffer 320 and connected to the output of the current-voltage conversion circuit 310A and the plurality of pMOS transistors T22 to T24 included in the quantizer 340 has high priorities.

The transistor having a low priority in decreasing the S value may have an S value similar to that of the conversion transistor 311. For example, a transistor formed on the same chip as the conversion transistor 311 may have an S value similar to that of the conversion transistor 311.

Figure 27:
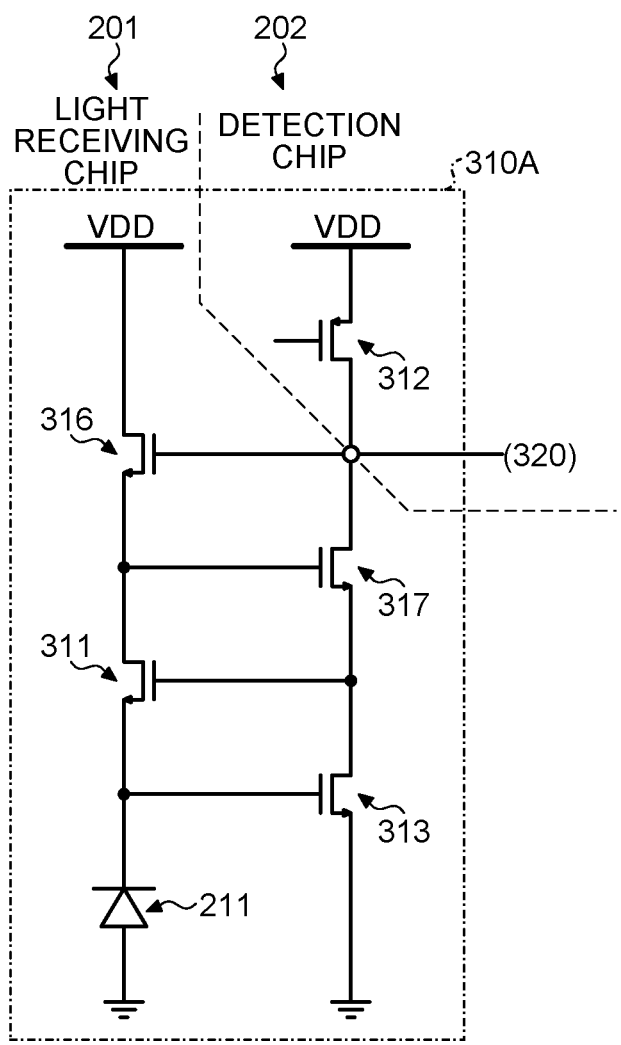
FIG. 27 is a circuit diagram depicting a configuration example of a current-voltage conversion circuit according to a modification of an embodiment of the present disclosure.

FIG. 27 is a circuit diagram illustrating a configuration example of the current-voltage conversion circuit 310A according to a modification of the embodiment of the present disclosure. As illustrated in FIG. 27, the conversion transistor 311, the second conversion transistor 316, the voltage supply transistor 313, and the second voltage supply transistor 317 of the current-voltage conversion circuit 310A may be disposed, for example, on the same light receiving chip 201 as the photodiode 221. The current source transistor 312 may be disposed on the detection chip 202.

In this case, the conversion transistor 311, the second conversion transistor 316, the voltage supply transistor 313, and the second voltage supply transistor 317 formed on the light receiving chip 201 are, for example, transistors having a bulk structure, and are formed on a FDSOI substrate. The transistors (including transistors of the buffer 320, the subtractor 330, and the quantizer 340) disposed on the detection chip 202 are transistors having a bulk structure and are formed on a PDSOI substrate. This configuration makes the S values of the transistors disposed on the light receiving chip 201 larger than the S values of the transistors disposed on the detection chip 202.

Here, it is preferable to separate the production process for different substrates (chips). Thus, the production cost can be further reduced while the conversion gain is further increased by setting the S values of the voltage supply transistor 313 and the second voltage supply transistor 317 to be the same as the S values of the conversion transistor 311 and the second conversion transistor 316. Further, since the voltage supply transistor 313, the second voltage supply transistor 317, the conversion transistor 311, and the second conversion transistor 316 are, for example, nMOS transistors, the pixels can be further miniaturized by disposing them on the same light receiving chip 201.

In this case, the S values of the voltage supply transistor 313 and the second voltage supply transistor 317 may be the same as the S values of the transistor T21 connected to the output of the current-voltage conversion circuit 310A and the plurality of pMOS transistors T22 to T24 included in the quantizer 340.

The chip disposition example of each transistor of the current-voltage conversion circuit 310A is not limited to the configuration of FIG. 27. For example, the current-voltage conversion circuit 310A may be disposed on the light receiving chip 201, and the buffer 320 and the subsequent portions may be disposed on the detection chip 202. Alternatively, the current-voltage conversion circuit 310A and the buffer 320 may be disposed on the light receiving chip 201, and the subtractor 330 and the subsequent portions may be disposed on the detection chip 202. The current-voltage conversion circuit 310A, the buffer 320, and the subtractor 330 may be disposed on the light receiving chip 201, and the quantizer 340 and the subsequent portions may be disposed on the detection chip 202.

For example, when the S value is adjusted by adjusting the gate length of the transistor, or when the S value is adjusted by the transistor structure such as a bulk structure and a FinFET structure, transistors having different S values may be disposed on one chip. In this case, the S value may be adjusted regardless of whether the transistor included in the address event detection circuit 300 is disposed on the light receiving chip 201 or the detection chip 202.

In this case, for example, the number of chip steps can be reduced by disposing the transistors on the chips according to the polarity of the transistor such as a pMOS transistor or an nMOS transistor. Alternatively, from the viewpoint of miniaturization of pixels, an nMOS transistor may be formed on the light receiving chip 201, and an nMOS transistor and a pMOS transistor may be disposed on the detection chip 202.

Alternatively, the transistors may be disposed on the chips according to a structure of the transistor, such as a bulk structure or a FinFET structure. For example, the conversion transistor 311, the second conversion transistor 316, the voltage supply transistor 313, and the second voltage supply transistor 317 in FIG. 27 may have a bulk structure, and the other transistors included in the address event detection circuit 300 may have a FinFET structure. The production cost of chips can be further reduced by narrowing down the structure of the transistors to be disposed on one chip to one like this. Of the transistors of the address event detection circuit 300, a transistor whose S value is made smaller than that of the conversion transistor 311 and a chip disposition of the transistor may be appropriately selected according to an adjustment method of the S value, priority, the production process, and the like.

For example, the production cost of chips may be further reduced by disposing the conversion transistor 311 and other transistors having an S value smaller than that of the conversion transistor 311 on different chips (substrates), even when the structures of the conversion transistor and the other transistors are different.

4. Application Example to Mobile Body

The technology according to the present disclosure (present technology) may be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a vessel, and a robot.

Figure 28:
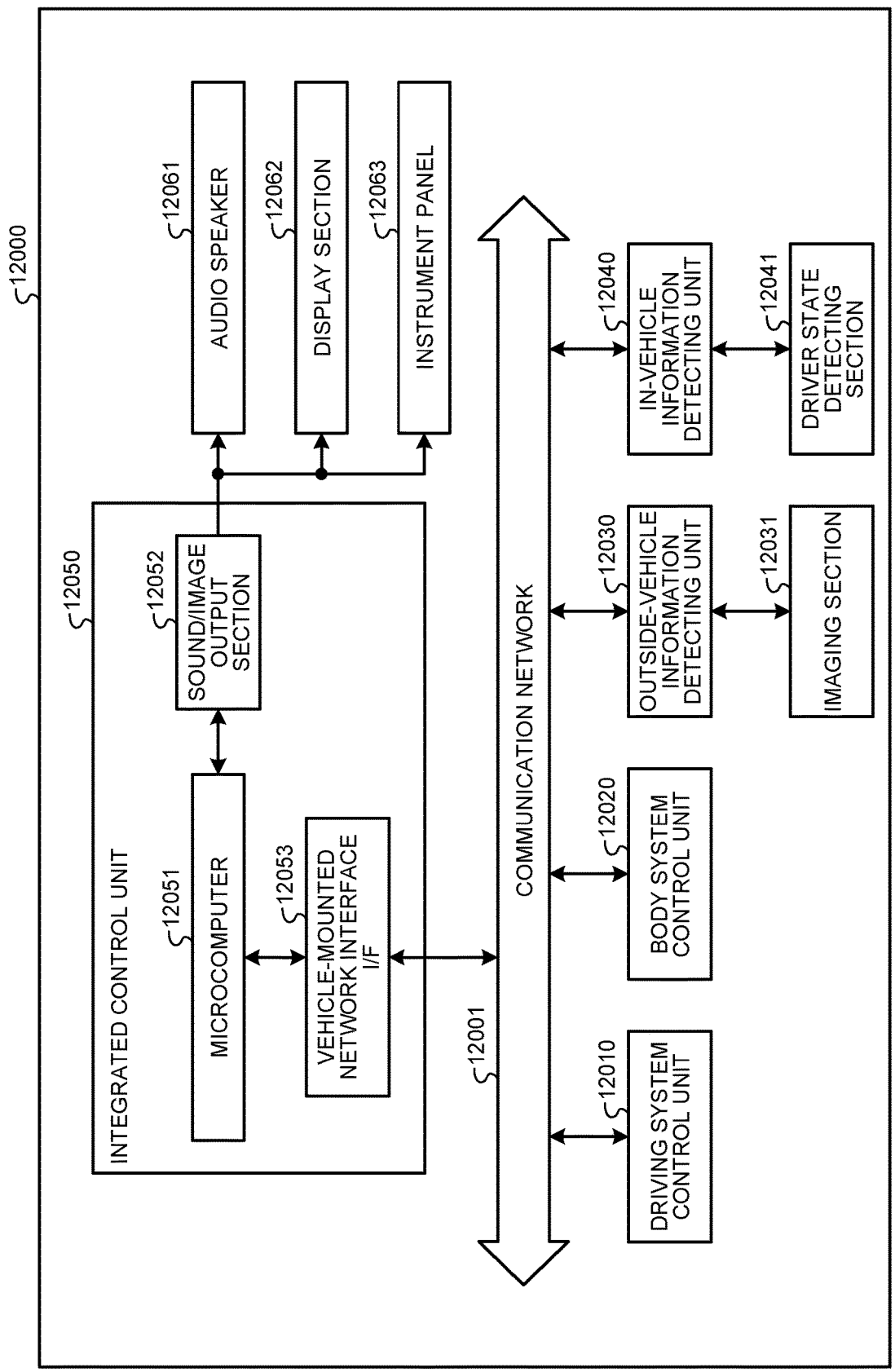
FIG. 28 is a block diagram depicting an example of schematic configuration of a vehicle control system as an example of a mobile body control system to which the technology according to an embodiment of the present disclosure may be applied.

FIG. 28 is a block diagram depicting an example of schematic configuration of a vehicle control system as an example of a mobile body control system to which the technology according to the present disclosure may be applied.

A vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, as a functional configuration of the integrated control unit 12050, a microcomputer 12051, a sound/image output section 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches may be input to the body system control unit 12020. The body system control unit 12020 receives these input radio waves or signals and controls a door lock device, the power window device, the lamps, or the like of the vehicle.

The outside-vehicle information detecting unit 12030 detects information about the outside of the vehicle mounted with the vehicle control system 12000. For example, the outside-vehicle information detecting unit 12030 is connected with an imaging section 12031. The outside-vehicle information detecting unit 12030 makes the imaging section 12031 image an image of the outside of the vehicle and receives the image. Based on the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light and outputs an electric signal corresponding to a received light amount of the light. The imaging section 12031 may output the electric signal as an image or may output the electric signal as information about a measured distance. In addition, the light received by the imaging section 12031 may be visible light or may be invisible light such as infrared rays.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. Based on detection information input from the driver state detecting section 12041, the in-vehicle information detecting unit 12040 may calculate a degree of fatigue of the driver or a degree of concentration of the driver or may determine whether the driver is dozing.

The microcomputer 12051 may calculate a control target value for the driving force generating device, the steering mechanism, or the braking device based on the information about the inside or outside of the vehicle obtained by the outside-vehicle information detecting unit 12030 or the in-vehicle information detecting unit 12040, and it can output a control command to the driving system control unit 12010. For example, the microcomputer 12051 may perform cooperative control intended to implement functions of an advanced driver assistance system (ADAS) including collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 may perform cooperative control intended for automated driving, which makes the vehicle to travel autonomously without depending on the operation of the driver, or the like, by controlling the driving force generating device, the steering mechanism, the braking device, or the like based on the information about the outside or inside of the vehicle obtained by the outside-vehicle information detecting unit 12030 or the in-vehicle information detecting unit 12040.

In addition, the microcomputer 12051 may output a control command to the body system control unit 12020 based on the information about the outside of the vehicle obtained by the outside-vehicle information detecting unit 12030. For example, the microcomputer 12051 may perform cooperative control intended to prevent a glare by controlling the headlamp to switch from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 28, an audio speaker 12061, a display section 12062, and an instrument panel 12063 are illustrated as the output device. The display section 12062 may include at least one of an on-board display and a head-up display, for example.

Figure 29:
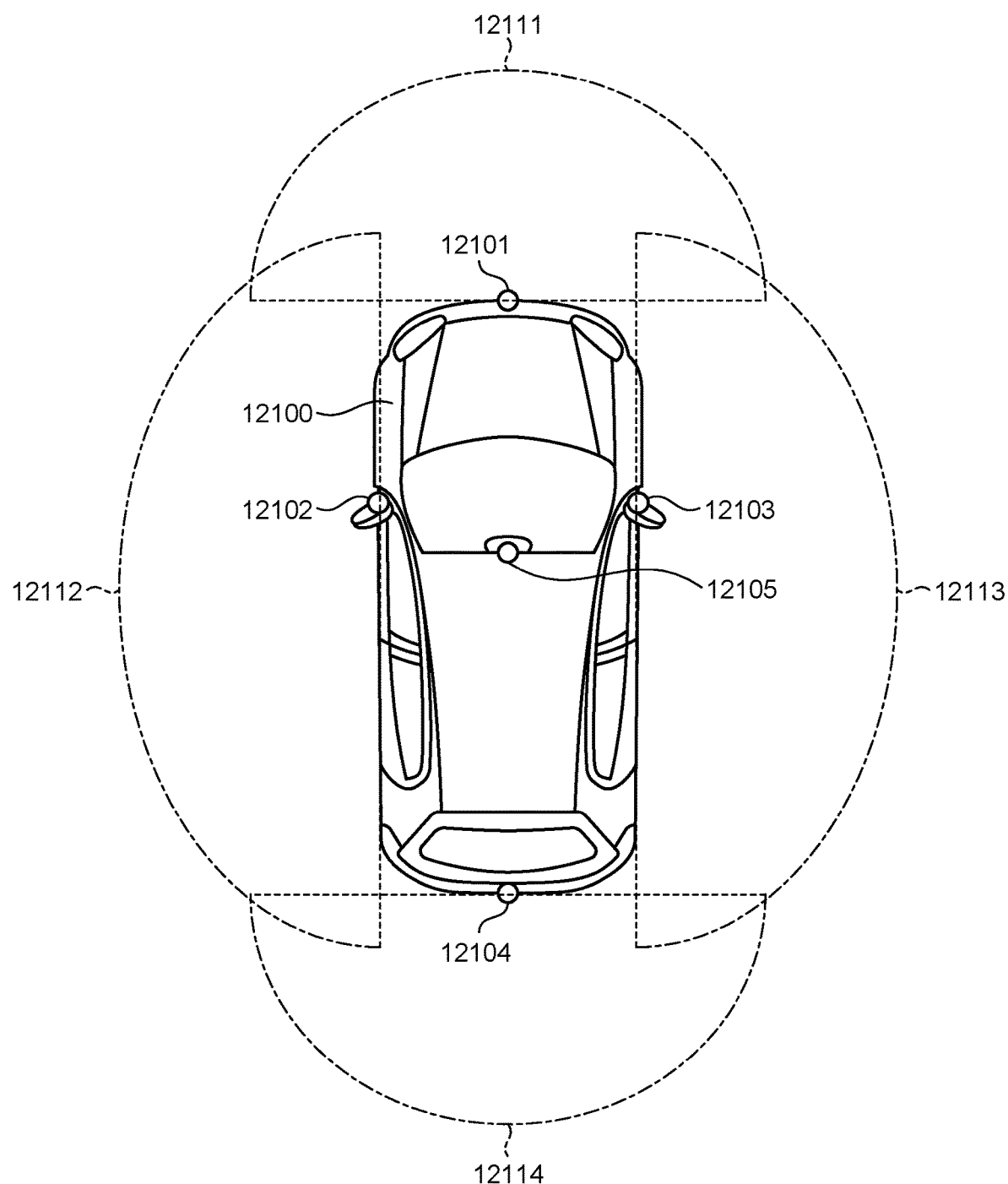
FIG. 29 is a diagram depicting an example of the installation position of an imaging section.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are provided at positions such as a front nose, a side mirror, a rear bumper, a back door, and an upper portion of a windshield in a vehicle interior of a vehicle 12100, for example. The imaging section 12101 provided at the front nose and the imaging section 12105 provided at the upper portion of the windshield in the vehicle interior mainly acquire images in front of the vehicle 12100. The imaging sections 12102 and 12103 provided at the side mirrors mainly acquire images of the sides of the vehicle 12100. The imaging section 12104 provided to the rear bumper or the back door mainly acquires an image of the rear of the vehicle 12100. The imaging section 12105 provided to the upper portion of the windshield in the vehicle interior is mainly used to detect a preceding vehicle, a pedestrian, an obstacle, a signal, a traffic sign, a lane, or the like.

FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of acquiring distance information. For example, at least one of the imaging sections 12101 to 12104 may be a stereo camera constituted of a plurality of imaging devices or may be an imaging device having pixels for phase difference detection.

For example, the microcomputer 12051 may determine a distance to each three-dimensional object within the imaging ranges 12111 to 12114 and a temporal change in the distance (relative speed with respect to the vehicle 12100) based on the distance information obtained from the imaging sections 12101 to 12104, and thereby extracting a nearest three-dimensional object in particular that is present on a traveling path of the vehicle 12100 and is travelling in substantially the same direction as the vehicle 12100 at a predetermined speed (for example, 0 km/hour or more) as a preceding vehicle. Further, the microcomputer 12051 may set a following distance to be maintained in front of a preceding vehicle in advance and perform automatic brake control (including following stop control), automatic acceleration control (including following start control), or the like. It is thus possible to perform cooperative control intended for automated driving that makes the vehicle travel autonomously without depending on the operation of the driver or the like.

For example, the microcomputer 12051 may classify three-dimensional object data on three-dimensional objects into three-dimensional object data of a two-wheeled vehicle, a standard-sized vehicle, a large-sized vehicle, a pedestrian, a utility pole, and other three-dimensional objects based on the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 may recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062 and performs forced deceleration or avoidance steering via the driving system control unit 12010. The microcomputer 12051 may thus assist in driving to avoid collision.

At least one of the imaging sections 12101 to 12104 may be an infrared camera that detects infrared rays. The microcomputer 12051 may, for example, recognize a pedestrian by determining whether there is a pedestrian in images taken by the imaging sections 12101 to 12104. Such recognition of a pedestrian is, for example, performed by a procedure of extracting characteristic points in the images taken by the imaging sections 12101 to 12104 as infrared cameras and a procedure of determining whether it is a pedestrian by performing pattern matching processing on a series of characteristic points representing the contour of the object. When the microcomputer 12051 determines that there is a pedestrian in the images taken by the imaging sections 12101 to 12104 and thus recognizes the pedestrian, the sound/image output section 12052 controls the display section 12062 so that a square contour line for emphasis is displayed to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the configurations described above. Specifically, the imaging apparatus 100 of FIG. 1 may be applied to the imaging section 12031. Applying the technology according to the present disclosure to the imaging section 12031 enables the conversion gain of the current-voltage conversion of the imaging apparatus 100 to increase while an increase in the circuit area is prevented, and the imaging accuracy of the imaging apparatus 100 can be improved.

5. Conclusion

The above-described embodiments illustrate example for embodying the present technology, and the matters in the embodiments and matters specifying the invention in the claims have a correspondence relationship. Similarly, the matters specifying the invention in the claims and the matters in the embodiments of the present technology denoted by the same names as the matters specifying the invention have a correspondence relationship. However, the present technology is not limited to the embodiments, and may be embodied by making various modifications to the embodiments without departing from the gist thereof.

The effects described in the present specification are merely examples and are not restrictive of the disclosure herein, and other effects may be achieved.

The present technology may also take the following configurations.

(1)
A solid-state imaging device comprising:
a photoelectric conversion device that performs photoelectric conversion of incident light;
a current-voltage conversion circuit including a first transistor that converts an amount of electric charge generated by the photoelectric conversion into a voltage signal; and
an output circuit that includes a second transistor having an S value smaller than an S value of the first transistor and generates an output signal based on the voltage signal.

(2)
The solid-state imaging device according to (1), wherein the second transistor is an amplification transistor included in the output circuit.

(3)
The solid-state imaging device according to (1) or (2), wherein
the output circuit includes a subtractor that calculates a change in the amount of electric charge, and
the subtractor includes the second transistor.

(4)
The solid-state imaging device according to any one of (1) to (3), wherein
the current-voltage conversion circuit further includes a third transistor having an S value smaller than the S value of the first transistor.

(5)
The solid-state imaging device according to any one of (1) to (4), wherein
the second transistor has a gate length longer than a gate length of the first transistor.

(6)
The solid-state imaging device according to any one of (1) to (4), wherein
the first transistor has a channel region on which ion implantation of an impurity having a polarity different from a polarity of the first transistor is performed, and
the second transistor has a channel region on which ion implantation of an impurity having the same polarity as the polarity of the second transistor is performed.

(7)
The solid-state imaging device according to any one of (1) to (4), wherein
the second transistor has an impurity region between a source and a drain shallower than an impurity region of the first transistor, and an impurity distribution of the impurity region of the second transistor is lower than an impurity distribution of the impurity region of the first transistor.

(8)
The solid-state imaging device according to any one of (1) to (4), wherein
the second transistor has a sidewall thicker than a sidewall of the first transistor.

(9)
The solid-state imaging device according to any one of (1) to (4), wherein
a reverse voltage is applied to a body terminal of the second transistor, and a forward voltage is applied to a body terminal of the first transistor.

(10)
The solid-state imaging device according to any one of (1) to (4), wherein
the second transistor has a device region layer having a thickness smaller than a thickness of a device region layer of the first transistor.

(11)
The solid-state imaging device according to any one of (1) to (4), wherein
the first transistor and the second transistor are fin field-effect transistors (FinFET), and
a width of a fin of the second transistor is smaller than a width of a fin of the first transistor.

(12)
The solid-state imaging device according to any one of (1) to (4), wherein
the first and second transistors are transistors having a gate-all-around (GAA) structure, and
a thickness of a channel of the second transistor is smaller than a thickness of a channel of the first transistor.

(13)
The solid-state imaging device according to any one of (1) to (4), wherein
the first transistor is a transistor having a PDSOI substrate structure, and
the second transistor is a transistor having a bulk structure.

(14)
The solid-state imaging device according to any one of (1) to (4), wherein
the first transistor is a transistor having a bulk structure, and
the second transistor is a transistor having a FDSOI substrate structure.

(15)
The solid-state imaging device according to any one of (1) to (4), wherein
the first transistor is a transistor having a bulk structure or a transistor having a PDSOI substrate structure, and
the second transistor is a fin field-effect transistor in which a width of a fin is smaller than ⅓ of a gate length.

(16)
The solid-state imaging device according to any one of (1) to (15), wherein
the first transistor and the second transistor are disposed on different substrates.

(17)
The solid-state imaging device according to any one of (1) to (16), wherein
the output circuit outputs a luminance change of the incident light incident on the photoelectric conversion device as the output signal based on the voltage signal.
(18)
An imaging apparatus comprising:
a solid-state imaging device; and
a processor that processes an output signal output from the solid-state imaging device, wherein
the solid-state imaging device includes:
a photoelectric conversion device that performs photoelectric conversion of incident light;
a current-voltage conversion circuit including a first transistor that converts an amount of electric charge generated by the photoelectric conversion into a voltage signal; and
an output circuit that includes a second transistor having an S value smaller than an S value of the first transistor and generates an output signal based on the voltage signal.

REFERENCE SIGNS LIST

100 IMAGING APPARATUS
110 OPTICAL UNIT
120 RECORDING UNIT
130 CONTROL UNIT
200 SOLID-STATE IMAGING DEVICE
201 LIGHT RECEIVING CHIP
202 DETECTION CHIP
211, 212, 213, 231, 232, 233 VIA DISPOSITION PART
220 LIGHT RECEIVING UNIT
221 PHOTODIODE
240 SIGNAL PROCESSING CIRCUIT
251 ROW DRIVE CIRCUIT
252 COLUMN DRIVE CIRCUIT
260 ADDRESS EVENT DETECTION UNIT
300 ADDRESS EVENT DETECTION CIRCUIT
310 CURRENT-VOLTAGE CONVERSION CIRCUIT
311 CONVERSION TRANSISTOR
331, 333 CAPACITOR
312 CURRENT SOURCE TRANSISTOR
313 VOLTAGE SUPPLY TRANSISTOR
320 BUFFER
330 SUBTRACTOR
332 INVERTER
334 SWITCH
340 QUANTIZER
341 COMPARATOR
350 TRANSFER CIRCUIT

The invention claimed is:

1. A solid-state imaging device comprising:
a photoelectric conversion device that performs photoelectric conversion of incident light;
a current-voltage conversion circuit including a first transistor that converts an amount of electric charge generated by the photoelectric conversion into a voltage signal; and
an output circuit that includes a second transistor having an S value smaller than an S value of the first transistor and generates an output signal based on the voltage signal.

2. The solid-state imaging device according to claim 1, wherein
the second transistor is an amplification transistor included in the output circuit.

3. The solid-state imaging device according to claim 1, wherein
the output circuit includes a subtractor that calculates a change in the amount of electric charge, and
the subtractor includes the second transistor.

4. The solid-state imaging device according to claim 1, wherein
the current-voltage conversion circuit further includes a third transistor having an S value smaller than the S value of the first transistor.

5. The solid-state imaging device according to claim 1, wherein
the second transistor has a gate length longer than a gate length of the first transistor.

6. The solid-state imaging device according to claim 1, wherein
the first transistor has a channel region on which ion implantation of an impurity having a polarity different from a polarity of the first transistor is performed, and
the second transistor has a channel region on which ion implantation of an impurity having the same polarity as the polarity of the second transistor is performed.

7. The solid-state imaging device according to claim 1, wherein
the second transistor has an impurity region between a source and a drain shallower than an impurity region of the first transistor, and an impurity distribution of the impurity region of the second transistor is lower than an impurity distribution of the impurity region of the first transistor.

8. The solid-state imaging device according to claim 1, wherein
the second transistor has a sidewall thicker than a sidewall of the first transistor.

9. The solid-state imaging device according to claim 1, wherein
a reverse voltage is applied to a body terminal of the second transistor, and a forward voltage is applied to a body terminal of the first transistor.

10. The solid-state imaging device according to claim 1, wherein
the second transistor has a device region layer having a thickness smaller than a thickness of a device region layer of the first transistor.

11. The solid-state imaging device according to claim 1, wherein
the first transistor and the second transistor are fin field-effect transistors (FinFET), and
a width of a fin of the second transistor is smaller than a width of a fin of the first transistor.

12. The solid-state imaging device according to claim 1, wherein
the first and second transistors are transistors having a gate-all-around (GAA) structure, and
a thickness of a channel of the second transistor is smaller than a thickness of a channel of the first transistor.

13. The solid-state imaging device according to claim 1, wherein
the first transistor is a transistor having a PDSOI substrate structure, and
the second transistor is a transistor having a bulk structure.

14. The solid-state imaging device according to claim 1, wherein
the first transistor is a transistor having a bulk structure, and
the second transistor is a transistor having a FDSOI substrate structure.

15. The solid-state imaging device according to claim 1, wherein
the first transistor is a transistor having a bulk structure or a transistor having a PDSOI substrate structure, and
the second transistor is a fin field-effect transistor in which a width of a fin is smaller than $\frac{1}{3}$ of a gate length.

16. The solid-state imaging device according to claim 1, wherein
the first transistor and the second transistor are disposed on different substrates.

17. The solid-state imaging device according to claim 1, wherein
the output circuit outputs a luminance change of the incident light incident on the photoelectric conversion device as the output signal based on the voltage signal.

18. An imaging apparatus comprising:
a solid-state imaging device; and
a processor that processes an output signal output from the solid-state imaging device, wherein
the solid-state imaging device includes:
a photoelectric conversion device that performs photoelectric conversion of incident light;
a current-voltage conversion circuit including a first transistor that converts an amount of electric charge generated by the photoelectric conversion into a voltage signal; and
an output circuit that includes a second transistor having an S value smaller than an S value of the first transistor and generates an output signal based on the voltage signal.

* * * * *